United States Patent
Yoshio

(10) Patent No.: US 7,567,116 B2
(45) Date of Patent: Jul. 28, 2009

(54) VOLTAGE CONVERTING CIRCUIT AND BATTERY DEVICE

(75) Inventor: Katsura Yoshio, Osaka-Fu (JP)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 11/867,756

(22) Filed: Oct. 5, 2007

(65) Prior Publication Data

US 2009/0058505 A1    Mar. 5, 2009

(30) Foreign Application Priority Data

Oct. 6, 2006    (JP) .............................. 2006-275688

(51) Int. Cl.
*G05F 1/10*    (2006.01)
(52) U.S. Cl. ...................... 327/535; 320/134
(58) Field of Classification Search ................. 320/134; 327/530, 535, 538, 543
See application file for complete search history.

(56) References Cited

U.S. PATENT DOCUMENTS

| | | | | |
|---|---|---|---|---|
| 6,992,463 B2* | 1/2006 | Yoshio | ........................ | 320/134 |
| 7,245,108 B2* | 7/2007 | Chertok et al. | .............. | 320/132 |
| 7,423,410 B2* | 9/2008 | Yoshio | ........................ | 320/134 |
| 7,459,884 B2* | 12/2008 | Sasaki et al. | ................ | 320/132 |

* cited by examiner

*Primary Examiner*—Jeffrey S Zweizig
(74) *Attorney, Agent, or Firm*—William B. Kempler; Wade J. Brady, III; Frederick J. Telecky, Jr.

(57) ABSTRACT

A voltage converting circuit and a battery device, aimed at the problem that the breakdown voltage required for the driving input of the selected switch element is increased as the potential of the selected power storage device is increased when a power storage device is selected from a plurality of power storage devices that are connected in series. A certain drive voltage for turning on p-type MOS transistors Q3, Q4 of selection circuit 121 is generated based on a certain drive current Ion flowing from one power storage element to ground level GND. In other words, even if the power storage device selected by selection circuit 121 has a high potential with respect to ground level GND, the drive voltage applied between the gate and source of MOS transistors Q3, Q4 can be held substantially constant.

16 Claims, 12 Drawing Sheets

US 7,567,116 B2

VOLTAGE CONVERTING CIRCUIT AND BATTERY DEVICE

FIELD OF THE INVENTION

The present invention pertains to a voltage converting circuit that converts the voltage of each of several series connected power storage devices into a voltage using a prescribed potential as a reference, for example, a voltage converting circuit that converts the voltage of each of several series connected battery cells in a battery device into the voltage of ground level in order to measure the voltage of each battery cell.

BACKGROUND OF THE INVENTION

In recent years, the energy density of lithium-ion secondary batteries, nickel-hydrogen secondary batteries, and other types of batteries has been significantly increased. As a result, the size and weight of these batteries has been reduced, and the batteries can drive devices for a long time. The improvement performance of these batteries has greatly contributed to the popularization of cellular phones and other portable electronic devices.

Accompanying the improved battery performance is the improved performance of the peripheral circuits. For example, a battery device (known as battery pack) having an electronic circuit used for realizing various functions, such as control of the remaining capacity, in the battery main body can be loaded into a notebook computer, video camera, or another electronic device with replaceable batteries. In recent years, battery devices using a microcomputer to realize these functions has become the norm.

On the other hand, the characteristics of lithium-ion secondary batteries and other high-performance batteries tend to deteriorate when the cell voltage becomes excessively high due to overcharging or extremely low due to over-discharging or when an excessively large charging current flows through the cell, which creates problems. Therefore, a battery device usually includes a circuit that can protect the battery by shutting off the power supply path between the battery and the electronic device during abnormal charging/discharging. Japanese Kokai Patent Application No. 2005-160169 discloses a technology regarding a battery protection circuit loaded in a battery device.

Since the voltage and capacity of a cell as the smallest unit of a battery are determined by the type of cell, plural cells can be connected in series in order to realize the power supply voltage or power capacity required for the device. In general, there is a difference in voltage between the cells due to the differences in the initial voltage or characteristics during charging/discharging of the series connected cells. If charging/discharging is continued with the variation [difference in voltage] left as is, some cells may be over-charged or discharged. Consequently, the voltage of each cell is monitored to control charging/discharging of each cell of a lithium-ion secondary battery and other secondary batteries that require a high level of protection for over-charging or discharging.

In order to measure the voltage of series connected cells, a selector circuit that selects one cell from a plurality of cells and connects it to a voltage measurement system is required. In this selector circuit, MOS transistors are usually used as switches. A drive circuit turns on and off each switch by supplying a drive voltage to the gates of the MOS transistors. However, since the number of the series connected cells has been increased and the potential of the cell with respect to the reference potential of the drive circuit has been increased, a higher breakdown voltage will be required between the gate and source of the MOS transistor. In order to increase the gate-source breakdown voltage, it is necessary to adopt an appropriate design and manufacturing process for the MOS transistors, which may create problems in terms of manufacturing cost or element surface area.

The breakdown voltage problem can be avoided by forming the selector circuit in multiple stages. For example, two selector circuits are adopted in the first stage, and half of the upper part and lower part of the series connected cells are shared by said two selectors. The selector circuit in the next stage selects one of the two selection results of the first stage. In this way, the gate-source breakdown voltage required in the first stage is halved compared with that of the selector circuit constituted in only one stage. However, when said multi-stage constitution is adopted, the surface area will be increased since the number of the elements is increased. Also, the circuits scale will increase significantly as the number of the cells as the selection objects is increased.

On the other hand, since the number of the series connected cells is increased and the voltage is raised, the error becomes large when converting the potential of the cell selected by the selector circuit to the ground level of the measurement system.

Conventionally, a differential amplifier circuit that attenuates the common mode voltage by resistive voltage division is usually used to convert the cell voltage to ground level. However, since high accuracy is required for the resistance as the potential of the cell of the measurement object is increased, it is difficult to measure the voltage accurately.

A method that uses a switch and a capacitor to convert the voltage of each cell to ground level is also taken into consideration. However, since the parasitic capacitance of the transistor that constitutes the switch becomes the error of the measurement, the electrostatic capacitance of the capacitor must be much higher than said parasitic capacitance. As a result, the size of the capacitor will be increased.

A general object of the present invention is to provide a voltage converting circuit, which can effectively avoid the fact that the breakdown voltage required for the driving input of the switch element regarding selection of one power storage device from a plurality of power storage devices as the potential of the selected power storage device is increased.

Another object of the present invention is to provide a voltage converting circuit, that can accurately convert the voltage without increasing the size of the circuit elements.

A third object of the present invention is to provide a battery device which can restrain the increase in the circuit area and can uniformly control the voltages of the series connected power storage devices by equipping it with said voltage converting circuit.

SUMMARY OF THE INVENTION

The voltage converting circuit according to one aspect of the present invention converts the voltage of each of a plurality of power storage devices connected in series into a voltage using a predetermined potential as a reference and has a selection circuit that connects one power storage device selected from said plural power storage devices to the output node pair and a sampling circuit that samples the voltage of said output node pair using said predetermined potential as a reference when said power storage device is selected by said selection circuit. Said selection circuit includes plural switch circuits that connect the terminals of each of said plurality of power storage devices to said output node pair. Said switch circuit includes a switch element connected between one of said power storage devices and one of said output nodes and a drive circuit that generates a certain drive voltage for turning on said switch element based on a certain drive current flowing from said one power storage device to said predetermined potential.

For the voltage converting circuit based on this aspect of the invention, a certain drive voltage that can turn on said switch element is generated based on a certain drive current flowing from one of the power storage devices to said predetermined potential. In other words, even if the power storage device selected by said selection circuit has a high potential with respect to said predetermined potential, the drive voltage for turning on said switch element is held constant. Consequently, even if the potential of the selected power storage device becomes high, the breakdown voltage of the driving input of said switch element still stays constant.

Said drive circuit may include a drive current generating circuit that generates the aforementioned drive current if said switch element is turned on and a voltage generating element that is inserted in the path of said drive current and generates the aforementioned drive voltage for turning on said switch element when the aforementioned drive current flows. In said configuration, when the aforementioned drive current is generated in said drive current generating circuit, the aforementioned drive voltage is generated in said voltage generating element. The drive voltage is received to turn on said switch element.

Said switch element can also include a series circuit of a first transistor and a second transistor of a first conductivity type connected between one of said power storage devices and one of said output nodes. Said drive current generating circuit can generate said drive current flowing from the middle connection point of said first and second transistors connected in series with said predetermined potential. Said voltage generating element can have one of its terminals connected to said middle connection point and the other terminal connected to the control terminals of said first and second transistors.

In this configuration, when the drive current generated by said drive current generating circuit flows from the middle connection point of the first and second transistors to said predetermined potential, the drive voltage generated by said voltage generating element is applied between said middle connection point and the control terminals of said first and second transistors. The drive voltage is received to turn on said first and second transistors, and current flows from said power storage device to said middle connection point.

Said switch element can also include a series circuit of a third transistor and a fourth transistor of a second conductivity type connected in parallel with the series circuit of said first and second transistors. Said drive circuit can include a judging circuit that determines whether said drive current generated by said drive current generating circuit when said switch element is turned on is below a predetermined threshold value that can turn on the series circuit of said first and second transistors and a drive voltage generating circuit that turns on said third and fourth transistors corresponding to the judgment result of said judging circuit.

In this configuration, when said switch element is turned on, said judging circuit determines whether said drive current generated by said drive current generating circuit is below a predetermined threshold value that can turn on the series circuit of said first and second transistors. If said drive current is below said threshold value, said drive voltage is generated by said drive voltage generating circuit. The series circuit of said third and fourth transistors receiving the drive voltage is turned on.

In this way, even if the drive voltage of said voltage generating element cannot turn on said first and second transistors since the potential difference between the potential of the selected power storage device and said predetermined potential is small, since the series circuit of said third and fourth transistors can be turned on instead, said switch element can be turned on.

In this case, two of said switch circuits that are turned on at the same time when one of said power storage devices is selected can share said judging circuit and turn on or off the series circuit of said third and fourth transistors at the same time corresponding to the judgment result of the common judging circuit.

By adopting this configuration, it is possible to avoid the circumstance that the series circuit of said first and second transistors is turned on by one of said two switch circuits that can turn on at the same time when one of said power storage devices is selected and, on the other hand, the series circuit of said third and fourth transistors is also turned on. In this way, the difference in the voltage drops between said two switch circuits can be restrained.

Said judging circuit, for example, can have a reference current generating circuit that has a circuit configuration equivalent to that of said drive current generating circuit and generates a certain reference current equivalent to the aforementioned drive current generated by said drive circuit generating circuit, a comparator that compares the node voltage in the path of said drive current in said drive current generating circuit with the node voltage in the path of said reference current in said reference current generating circuit, and a signal generating circuit that turns on either the series circuit of said first and second transistors or the series circuit of said third and fourth transistors and turns off the other series circuit corresponding to the comparison result of said comparator.

By adopting said configuration, a certain reference current equivalent to the aforementioned drive current is generated in said reference current generating circuit with a circuit configuration equivalent to that of said drive current generating circuit. Said comparator compares the node voltage in the path of said drive current in said drive current generating circuit with the node voltage in the path of said reference current in said reference current generating circuit.

Since said reference current in said reference current generating circuit is constant, the node voltage in said path is also constant. On the other hand, since the drive current of said drive current generating circuit varies as a function of the potential of said power storage device, the node voltage in that path can also vary corresponding to the drive current. Consequently, when said comparator compares these node voltages, the variation in the drive current generated by said drive current generating circuit can be detected.

If said switch element is on, depending on the signal generated by said signal generating circuit corresponding to the comparison result of the comparator, either the series circuit of said first and second transistors or the series circuit of said third and fourth transistors will be turned on, while the other series circuit will be turned off.

In one aspect, said sampling circuit has a first transistor, a second capacitor, an amplifier, a first switch element, a second switch element, a third switch element, a fourth switch element connected between the sixth and the second nodes, a fifth switch element, a sixth switch element, a seventh switch element, an eighth switch element, a ninth switch element, and a control circuit. Said output node pair has a first and a second node. The first capacitor is connected between the third and fourth nodes. The second capacitor is connected between the fifth and the sixth nodes and has the same electrostatic capacitance as said first capacitor. Said amplifier uses said predetermined potential as a reference and amplifies the voltage obtained by subtracting the voltage at the first input terminal from the voltage at the second input terminal. The first switch element is connected between the third and the first nodes. The second switch element is connected between the fourth and the first nodes. The third switch element is connected between the fifth and the first nodes. The fourth switch element is connected between the third node and said predetermined potential. The fifth switch element is connected between the sixth node and said predetermined potential. The seventh switch element is connected between the fourth node and second input terminal. The eighth switch element is connected between the fifth node and the first input terminal. The ninth switch element is connected between the third node and the output terminal of said amplifier.

Said control circuit controls said first through ninth switch elements. In other words, said control circuit keeps the first, second, third, and fourth switch elements on and keeps the fifth, sixth, seventh, eighth, and ninth switch elements off in the first stage, turns off the first, second, third, and fourth switch elements in the second stage after the first stage, turns on the fifth and sixth switch elements in the third stage after the second stage, turns off the fifth switch element in the fourth stage after the third stage, and turns on the seventh, eighth, and ninth switch elements in the fifth stage after the fourth stage.

By adopting said configuration, in the first stage, the first capacitor is short-circuited by said first and second switch elements. Also, the voltage of the power storage device selected by said selection circuit is applied to said second capacitor via said third and fourth switch elements. In the second stage, the first through the fourth switch elements are off. In the third stage, when the fifth and sixth switch elements are on, the charge accumulated in the parasitic capacitor of said second and seventh switch elements is distributed to said first capacitor. The charge accumulated in the parasitic capacitor of said third and eighth switch elements is distributed to said second capacitor.

In the fourth stage, the fifth switch element is off. In the fifth stage, when the seventh, eighth, and ninth switch elements are turned on, the output voltage of said amplification circuit is negatively fed back to reduce the voltage difference between said fourth and fifth nodes. As a result, the output voltage of said amplification circuit becomes a voltage corresponding to the voltage of said first capacitor and the voltage of said second capacitor.

Said sampling circuit includes a buffer circuit that generates an output voltage corresponding to the input voltage, a tenth switch element connected between the output terminal of said amplifier and the input terminal of said buffer circuit, and a third capacitor connected between the input terminal of said buffer circuit and said predetermined potential. Said control circuit turns on the tenth switch element in the sixth stage after the fifth stage and turns off the tenth switch in the seventh stage after the sixth stage.

By adopting said configuration, when the tenth switch is turned on in the sixth stage, the output voltage of said amplification circuit is applied to the third capacitor. When the tenth switch is turned off in the seventh stage, the output voltage of said amplification circuit applied to the third capacitor can be maintained.

The battery device based on the second point of view of the present invention has a plurality of power storage devices connected in series, a voltage converting circuit that converts the voltage of each of said plurality of power storage devices into a voltage using a predetermined potential as a reference, a current bypass current that bypasses the current flowing through each of said plurality of power storage devices corresponding to an input control signal, and a control circuit that measures the voltage of each power storage device converted by said voltage converting circuit and generates said control signal for controlling said current bypass circuit so that the voltages of said plural power storage devices become uniform based on the measurement result. Said voltage converting circuit has the same configuration as the voltage converting circuit based on said first point of view.

In said battery device, the voltage of each power storage device converted by said voltage converting circuit is measured in said control circuit. Based on the measurement result, said current bypass circuit is controlled so that the voltages of said plurality of power storage devices become uniform.

According to aspects of the present invention, it is possible effectively to avoid the problem that the breakdown voltage required for the driving input of the selected switch element is increased as the potential of the selected power storage device is increased when a power storage device is selected from a plurality of power storage devices that are connected in series.

REFERENCE NUMERALS AND SYMBOLS AS SHOWN IN THE DRAWINGS

In the figures, 100 represents a battery device, Q1-Q4 p-type MOS transistors, Q5-Q8, Q7A, Q8A n-type MOS transistors, 117 a selection circuit, 118 a voltage amplification circuit, SW1_1-SW11_1, SW1_2-SW11_2 switch circuits, R1-R4, R1A resistors, 122 a control circuit, 160 a microcomputer, 130 a reference current generating circuit, 131 a comparator, 132 a latch circuit, 133 an AND-gate, 134 a drive voltage generating circuit, 140 a sample-and-hold circuit, 144 a differential amplifier circuit, C1-C3 capacitors, SW1-SW13 switch elements, 141, 145 an amplification circuit, 143 a buffer circuit.

DESCRIPTION OF THE EMBODIMENT

In the following, an embodiment of the present invention will be explained based on the figures.

Figure 1:
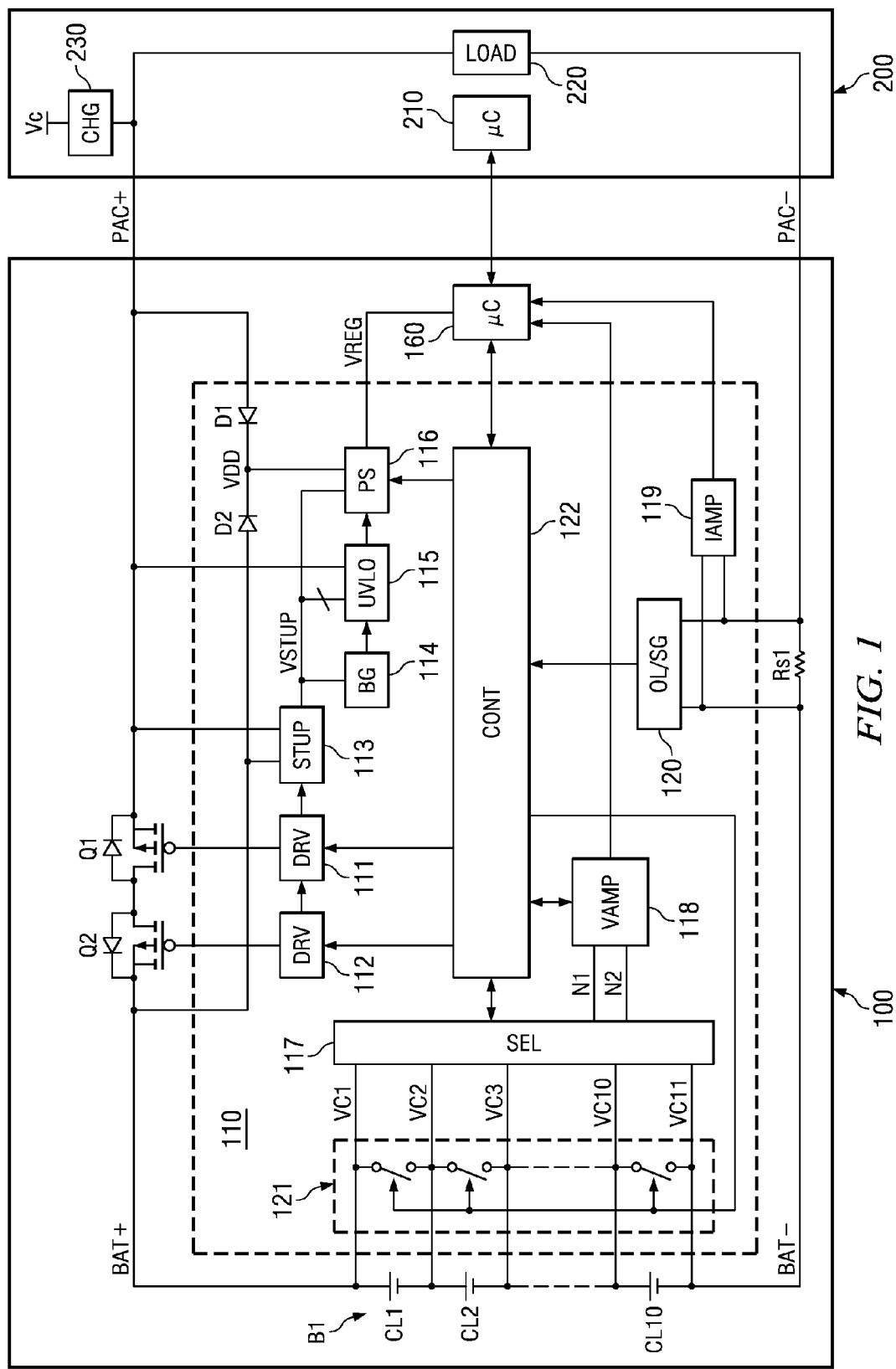
FIG. 1 is a diagram illustrating a configuration example of the battery device disclosed in the embodiment of the present invention.

FIG. 1 is a diagram illustrating a configuration example of the battery device disclosed in the embodiment of the present invention.

Battery device 100 shown in FIG. 1 has p-type MOS transistors Q1, Q2, battery B1, resistor Rs1 for current detection, analog front end part (AFE part) 110, and microcomputer 160. AFE part 110 includes diodes D1, D2, drive circuits 111, 112 of MOS transistors Q1, Q2, setup circuit 113, reference voltage generating circuit 114, low-voltage operation lock circuit 115, power supply circuit 116, selection circuit 117, voltage amplification circuit 118, current amplification circuit 119, overcurrent/short circuit detection circuit 120, current bypass circuit 121, and control circuit 122.

The circuit block including selection circuit 117 and voltage amplification circuit 118 is an example of the voltage converting circuit of the present invention. Selection circuit 117 is an example of the selection circuit of the present invention. The circuit block including control circuit 122 and microcomputer 160 is an example of the control circuit of the present invention.

Battery B1 is constituted by connecting a plurality of power storage devices, such as lithium-ion secondary batteries, in series. In the example shown in FIG. 1, 10 power storage devices CL1-CL10 are connected in series between the positive electrode BAT+ and the negative electrode BAT− of battery B1. Said power storage devices can be one battery cell or a plurality of battery cells connected in series or in parallel.

The drains of MOS transistors Q1 and Q2 are connected to each other. The source of MOS transistor Q1 is connected to the positive electrode PAC+ of battery device 100. The source of MOS transistor Q2 is connected to the positive electrode BAT+ of battery B1. The gates of MOS transistors Q1, Q2 are driven by drive circuits 111, 112 of AFE part 110. Resistor Rs1 for current detection is connected between the negative electrode BAT− of battery B1 and the negative electrode PAC− of battery device 100. AFE part 110 generates power supply voltage VREG based on the voltage supplied from battery B1 or the battery supplied from the host electronic device 200 via positive electrode PAC+ and PAC− and supplies said voltage to microcomputer 160.

When microcomputer 160 is started, AFE part 110 communicates with microcomputer 160 via a prescribed interface to store the set value sent from microcomputer 160 in an internal register. Then, MOS transistors Q1, Q2 are controlled to turn on and off, and the voltage of each battery cell (CEL1-CEL10) is detected according to the set value stored in the register.

For example, AFE part 110 detects the voltage of each battery cell (CEL1-CEL10) according to the set value sent from microcomputer 160 and outputs the voltage to microcomputer 160. The charging/discharging current of each battery cell is controlled according to the setpoint value sent from microcomputer 160 that monitors said voltage so that the voltages of battery cells (CEL1-CEL10) become uniform.

Also, AFE part 110 amplifies the voltage generated across resistor Rs1 and outputs it as the current detecting signal for battery B1 to microcomputer 160. The voltage of each battery cell or the current detecting signal of battery B1 output from AFE part 110 to microcomputer 160 is used to detect the fully charged state of battery B1 during charging and detect the remaining capacity of battery B1 during discharging. Also, AFE part 110 monitors the charging/discharging current of battery B1 based on the voltage generated across resistor Rs1 and shuts off MOS transistors Q1, Q2 to protect battery B1 if an overcurrent or a short-circuit is detected.

Microcomputer 160 monitors the charging/discharging current of battery B1 and the voltage of each cell and equalizes the voltage of each battery cell, predicts the fully charged state or remaining battery capacity of battery B1, and sets the threshold values for detecting over current/short circuit current in AFE part 110. In other words, microcomputer 160 has an analog/digital converter circuit, which converts the analog detection signals output from voltage amplification circuit 18 or current amplification circuit 119 into digital detection signals. It also communicates with control circuit 122 via a prescribed interface to control switch of selection circuit 117 and the turning on and off of MOS transistors Q1, Q2.

Also, microcomputer 160 communicates with electronic device 200 by SMBUS or another inter-chip interface to provide information regarding the remaining battery capacity, etc. of battery device 100 to electronic device 200. Battery device 100 is connected to personal computer or another electronic device 200 for use. Electronic device 200 has microcomputer 210, load 220, and charging circuit 230 as shown in FIG. 1. Microcomputer 210 communicates with microcomputer 160 in battery device 100 via a SMBUS or another interface to obtain the remaining battery capacity or other information. Also, charging circuit 230 is controlled based on the information obtained from battery device 100 to set the charging current of battery B1 to an appropriate level. Load 220 is the internal load of electronic device 200 operated under the power supplied from battery device 100.

Charging circuit 220 generates a charging current for charging battery device 100.

In the following, the configuration of AFE part 110 will be explained in detail.

The cathodes of diodes D1 and D2 are connected to each other. The anode of diode D1 is connected to the positive electrode PAC+ of battery device 100. The anode of diode D2 is connected to the positive electrode BAT+ of battery B1.

Voltage VDD generated at the commonly connected cathode of diodes D1 and D2 is supplied to power supply circuit 116 to be described below.

Drive circuit 11 drives the gate of MOS transistor Q1 in accordance with the control signal output from control circuit 122. In other words, when MOS transistor Q1 is turned on, its gate potential becomes lower than the source potential (the potential at positive electrode BAT+), and a voltage higher than the threshold value is applied between the gate and source of MOS transistor Q1. When MOS transistor Q1 is turned off, the gate potential is raised to the source potential and the voltage between the gate and source of MOS transistor Q1 becomes lower than the threshold value.

Drive circuit 112 drives the gate of MOS transistor Q2 in accordance with the control signal output from control circuit 122. In other words, when MOS transistor Q2 is turned on, its gate potential becomes lower than the source potential (potential at positive electrode PAC+), and a voltage higher than the threshold value is applied between the gate and the source of MOS transistor Q2. When MOS transistor Q2 is turned off, the gate potential is raised to the source potential and the voltage between the gate and source of MOS transistor Q2 becomes lower than the threshold value.

Setup circuit 113 generates the startup voltage VSTUP needed for starting AFE part 110 based on the voltage of the battery generated at positive electrode BAT+ or the voltage from electronic device 200 supplied to positive electrode PAC+. Reference voltage generating circuit 114 generates a certain reference voltage VBG by using a band gap circuit, etc. It operates after receiving the startup voltage supplied from setup circuit 113.

When the voltage at positive electrode PAC+ is below a prescribed voltage, low-voltage operation circuit 115 stops the supply of power supply voltage VREG generated by power supply circuit 116 and starts power supply circuit 116 when the voltage at positive electrode PAC+ exceeds the prescribed voltage. Low-voltage operation lock circuit 115 operates after receiving startup voltage VSTUP supplied from setup circuit 113.

Power supply circuit 116 generates power supply voltage VREG supplied to the various circuits in AFE part 110 and to microcomputer 160. Power supply circuit 116 includes a low-dropout linear regulator. Its input is connected to the positive electrode PAC+ of battery device 100 via diode D1 or the positive electrode BAT+ of battery B1 via diode D2; it lowers the input voltage and generates a constant power supply voltage VREG. The control circuit of power supply circuit 116 is started after receiving startup voltage VSTUP supplied from setup circuit 113.

Selection circuit 117 connects a power storage device selected from series connected power storage devices CL1-CL10 to output node pair (N1, N2). The details of selection circuit 117 will be explained with reference to FIGS. 2-5 further below.

Voltage amplification circuit 118 converts the voltage of the power storage device selected by selection circuit 117 to a voltage using a prescribed ground level as reference and outputs it to microcomputer 160. The details of voltage amplification circuit 118 will be explained with reference to FIGS. 6-19 further below.

Current amplification circuit 119 amplifies the voltage generated across resistor Rs1 and outputs it as the detection signal for the charging/discharging signal flowing through battery B1 to microcomputer 160. Overcurrent/short circuit detection circuit 120 detects the occurrence of the overcurrent or short-circuit in battery B1 depending on whether the voltage generated across resistor Rs1 exceeds the prescribed threshold value for a prescribed period of time and outputs the detection result to control circuit 122.

Current bypass circuit 121 bypasses the current flowing through each of power storage devices CL1-CL10 corresponding to the control signal input from control circuit 122. Current bypass circuit 121 has 10 switches connected in parallel with power storage devices CL1-CL10, as shown in FIG. 1. An internal resistor is included in each switch. When it is on, in accordance with the control signal of control circuit 122, it bypasses the charging/discharging currents of the power storage devices without short-circuiting the power storage devices connected in parallel.

Control circuit 122 starts to operate when power supply voltage VREG is received. It outputs the control signals for controlling the various circuits in AFE part 110. In other words, control circuit 122 communicates with microcomputer 160 via a prescribed interface and stores the setpoint values sent from microcomputer in the internal registers. The control circuit controls the various circuits in AFE part 110 corresponding the setpoint values stored in the registers.

For example, the control circuit controls the selection of the power storage device as the detection object by selection circuit 117, the presence/absence of current bypass of each power storage device in current bypass circuit 121, the turning on and off of MOS transistors Q1, Q2 corresponding to the detection result of overcurrent/short-circuit detection circuit 119, and the setup of the overcurrent detection threshold value in overcurrent/short-circuit detection circuit 119 corresponding to the setpoint values stored in the registers.

In the following, selection circuit 117 and voltage amplification circuit 118 that constitute the voltage converting circuit disclosed in the embodiment of the present invention will be explained in detail.

Selection Circuit 117

Figure 2:
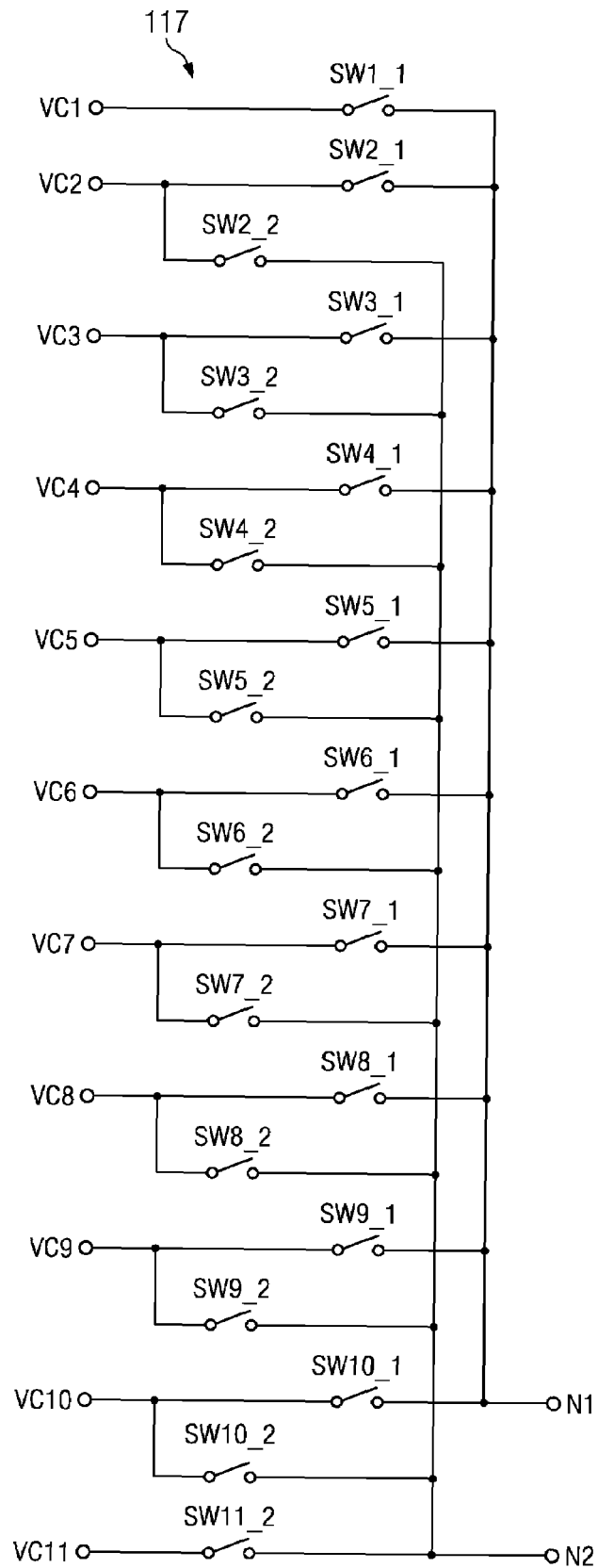
FIG. 2 is a diagram illustrating an example of the configuration of the selection circuit.

FIG. 2 shows an example of the configuration of selection circuit 117.

Selection circuit 117 shown in FIG. 2 has switch circuits SW1_1, SW2_1, ..., SW10_1 and SW2_2, SW3_2, ..., SW11_2 that connect the terminals of power storage devices CL1, ..., CL10 and output node pair (N1, N2).

Power storage devices CL1, CL2, ..., CL10 are connected in series in the stated order. The positive electrode of power storage device CL1 corresponds to the positive electrode BAT+ of battery B1. The negative electrode of power storage device CL10 corresponds to the negative electrode BAT− of battery B1.

In this connection, nodes VC1, VC2, ..., VC10 shown in FIG. 1 correspond to the positive electrodes of power storage devices CL1, CL2, ..., CL10, respectively. Node VC11 corresponds to the negative electrode of power storage device CL10 (negative electrode BAT− of battery B1).

In this case, when "n" is an integer in the range of 1-10, switch circuit SWn_1 is connected between node VCn and node N1. Switch circuit SW(n+1)_2 is connected between node VC(n+1) and node N2.

If power storage device CLn is selected, control circuit 122 turns on both switch circuit SWn_1 and switch circuit SW(n+1)_2 and turns off other switch circuits.

Figure 3:
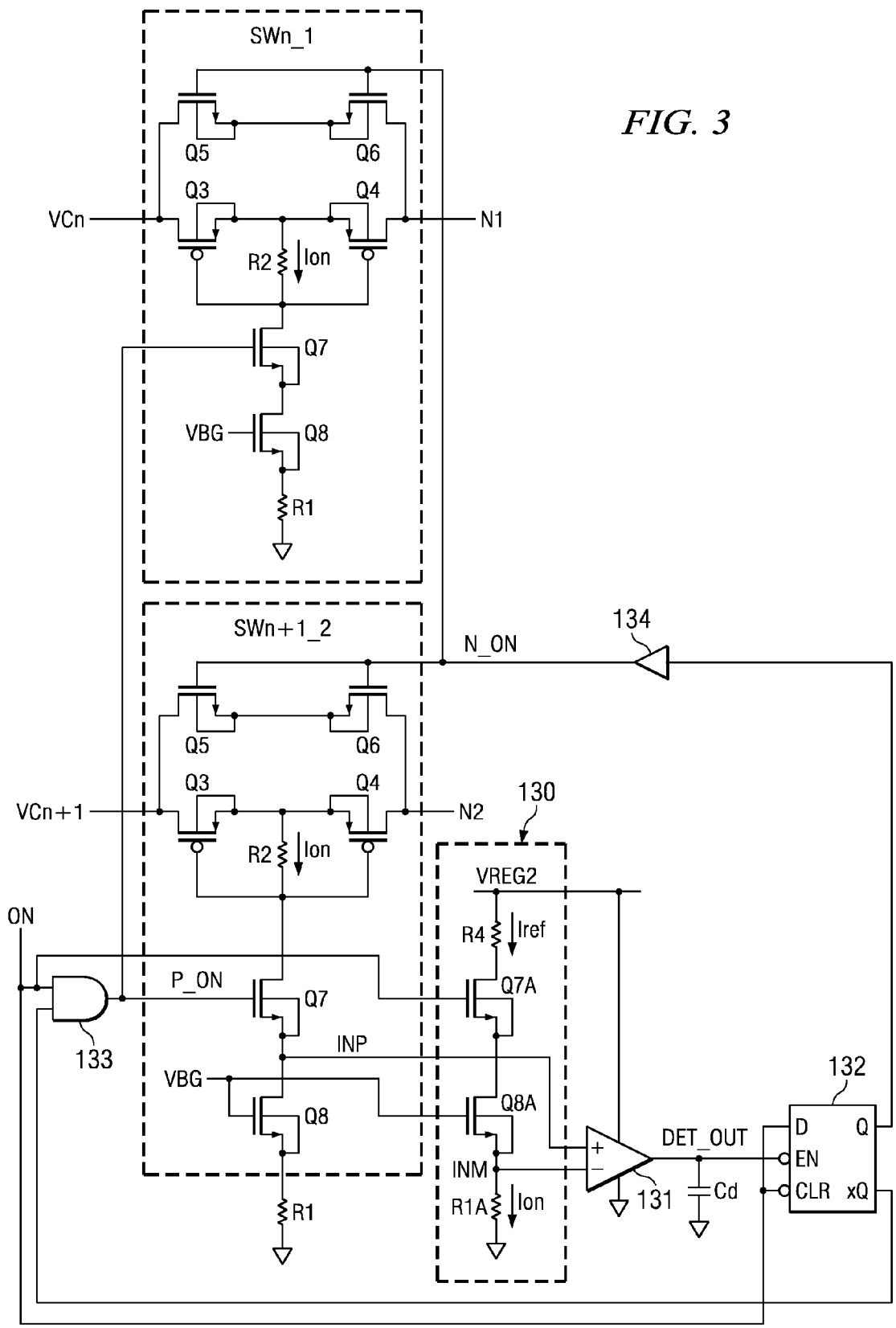
FIG. 3 is a diagram illustrating an example of the configuration of the switch circuit in the selection circuit.

FIG. 3 shows an example of the configuration of said switch circuit.

Switch circuit SWn_1 has a series circuit of p-type MOS transistors Q3 and Q4 connected between nodes VCn and N1, series circuit of n-type MOS transistors Q5 and Q6 connected in parallel with said series circuit, n-type MOS transistors Q7, Q8, and resistors R1, R2.

Also, switch circuit SW(n+1)_2 has a series circuit of p-type MOS transistors Q3 and Q4 connected between nodes VC(n+1) and N2, a series circuit of n-type MOS transistors Q5 and Q6 connected in parallel with said series circuit, n-type MOS transistors Q7, Q8, and resistors R1, R2. Since switch circuits SWn_1 and SW(n+1)_2 have an equivalent circuit configuration, the constituent parts are represented by the same symbols.

The circuit block including MOS transistors Q1, Q2, Q3, Q4 is an example of the switch element of the present invention. The series circuit of MOS transistors Q3 and Q4 is an example of the series circuit of the first and second transistors of the present invention. The series circuit of MOS transistors Q5 and Q6 is an example of the series circuit of the third and fourth transistors of the present invention. The circuit block including MOS transistors Q7, Q8 and resistor R1 is an example of the drive current generating circuit of the present invention. Resistor R2 is an example of the voltage generating element of the present invention.

The sources of MOS transistors Q3 and Q4 are connected together. The drain of MOS transistor Q3 is connected to the electrode terminal of a power storage element (VCn or VC(n+1)). The drain of MOS transistor Q4 is connected to the output of selection circuit 117 (N1 or N2). The commonly connected sources of MOS transistors Q3 and Q4 are connected to one of the terminals of resistor R2. The other terminal of resistor R2 is connected to the gates of MOS transistors Q3 and Q4. The sources of MOS transistors Q5 and Q6 are connected together. The drain of MOS transistor Q5 is connected to the electrode terminal of a power storage element (VCn or VC(n+1)). The drain of MOS transistor Q6 is connected to the output node (N1 or N2).

The drive voltage N_ON of drive voltage generating circuit 134 to be described below is supplied to the gates of MOS transistors Q5 and Q6.

The source of MOS transistor Q8 is connected to ground level GND via resistor R1. Its drain is connected to the sources of MOS transistors Q3, Q4 via MOS transistor Q7 and resistor R2. Reference voltage VBG generated by reference voltage generating circuit 114 is applied to the gate of MOS transistor Q8. MOS transistor Q7 is inserted in the path of current Ion flowing from the sources of MOS transistors Q3, Q4 to ground level GND via MOS transistor Q8, resistor R1. The output signal P_ON of AND-gate 133 to be described below is supplied to the gate of MOS transistor Q7.

Besides said individual constituent elements, switch circuits SWn_1 and SW(n+1)_2 share reference current generating circuit 130, comparator 131, capacitor Cd, latch circuit 312, AND-gate 133, and drive voltage generating circuit 134.

The circuit block including reference current generating circuit 130, comparator 131, latch circuit 132, and AND-gate 133 is an example of the judging circuit of the present invention.

Reference current generating circuit 131 is an example of the reference current generating circuit of the present invention. Comparator 131 is an example of the comparator of the present invention. The circuit block including latch circuit 132 and AND-gate 133 is an example of the signal generating circuit of the present invention. Drive voltage generating circuit 134 is an example of the drive voltage generating circuit of the present invention.

Reference current generating circuit 130 has MOS transistors Q7A, Q8A, resistor R1A as constituent elements equivalent to said MOS transistors Q7, Q8, resistor R1 as well as resistor R4. When MOS transistors Q3, Q4 are on, a certain reference current Iref equivalent to drive current Ion flowing through MOS transistor Q8 is generated.

The source of MOS transistor Q8A is connected to ground level GND via resistor R1A. Its drain is connected to power supply voltage VREG2 via MOS transistor Q7A and resistor R4. Power supply voltage VREG2 is supplied from power supply circuit 116. Reference voltage VBG is applied to the gate of MOS transistor Q8A. MOS transistor Q7A is inserted in the path of reference current Ion flowing from power supply voltage VREG2 to ground level GND via MOS transistor Q8a, resistor R1A. The common control signal ON for switch circuits SWn_1 and SW(n+1)_2 is input to the gate of MOS transistor Q7A.

Comparator 131 compares the drain voltage of MOS transistor Q8 with the source voltage of transistor Q8A. In other words, signal DET_OUT, which is at the high level if the drain voltage INP of MOS transistor Q8 is higher than the source voltage of transistor Q8A and is at the low level otherwise, is output. Capacitor Cd is connected between the output of comparator 131 and ground level GND.

Latch circuit 132 initializes the input signal of drive voltage generating circuit 134 to the low level and the input signal of AND-gate 133 to high level if control signal ON is at the low level. When control signal ON changes from the low level to the high level in the initialization state, if the output of comparator 131 is at the high level, the input signal of drive voltage generating circuit 134 and the input signal of AND-gate 133 are maintained in the initialized state. When the output of comparator 131 changes from high level to low level, the input signal of drive voltage generating circuit 134 is changed to the high level, while the input signal of AND-gate 133 is changed to the low level.

When a high-level signal is input from latch circuit 132, drive voltage generating circuit 134 inputs drive voltage N_ON at the high level to the gates of MOS transistors Q5, Q6 to turn them on. When a low-level signal is input from latch circuit 132, drive voltage N_ON is changed to the low level to turn off MOS transistors Q5, Q6. AND-gate 133 calculates the logical product of the input signal from latch circuit 132 and control signal ON and inputs the signal of the calculation result to the gate of MOS transistor Q7.

In the following, the operation of switch circuits SWn_1 and SW(n+1)_2 will be explained based on FIGS. 4 and 5.

Figure 4:
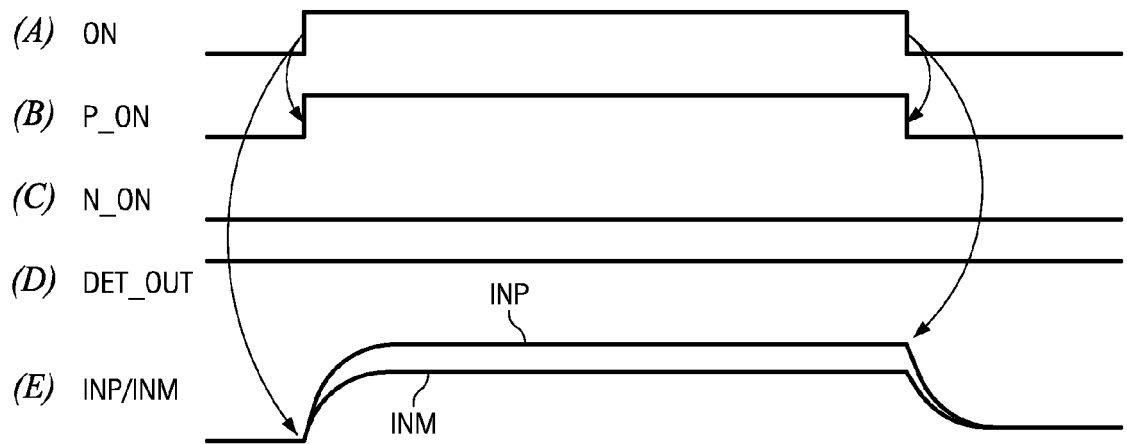
FIG. 4 is a diagram illustrating an operation example when the drive current of the switch circuit is much larger than the reference current.

FIG. 4 shows an operation example in the case when the drive current Ion of switch circuit SW(n+1)_2 is much larger than reference current Iref.

When control signal ON via the high level (FIG. 4(A)), since high-level signal is input from latch circuit 132 to AND-gate 133, the output signal P_ON of AND-gate 133 goes to the high level (FIG. 4(B)), and MOS transistor Q7 turns on. In this way, drive current I2 flows from the sources of MOS transistors Q3, Q4 via resistor R2 and MOS transistor Q7. Since an almost constant voltage (VBG-Vth) obtained by subtracting the threshold value Vth of MOS transistor Q8 from reference voltage VBG is applied to resistor R1, drive current Ion is constant and can be expressed as "(VBG−Vth)/r1" ("r1" is the resistance of resistor R1). The reference current Iref of reference current generating circuit 130 is almost as large as said drive current Ion.

When drive current Ion flows through resistor R2, a drive voltage of "(VBG−Vth)·(r2/r1)" is generated across resistor R2 ("r2" is the resistance of resistor R2). When said constant drive voltage is applied between the gate and source, MOS transistors Q3, Q4 turn on.

On the other hand, since resistors R1 and R1A have the same resistance, if drive current Ion is approximately equal to reference current Iref, the sources of MOS transistors Q7 and Q8 are at approximately the same voltage. Consequently, the drain voltage INP of MOS transistor Q8 is higher than the source voltage INM of transistor Q8A by as much as the drain-source voltage of MOS transistor Q8 (FIG. 4(E)). The output signal DET_OUT of comparator 131 goes to the high level (FIG. 4(D)). The drive voltage N_ON of drive voltage generating circuit 134 goes to the low level (FIG. 4(C)). Since drive voltage N_ON goes to the low level, MOS transistors Q5, Q6 turn off.

Figure 5:
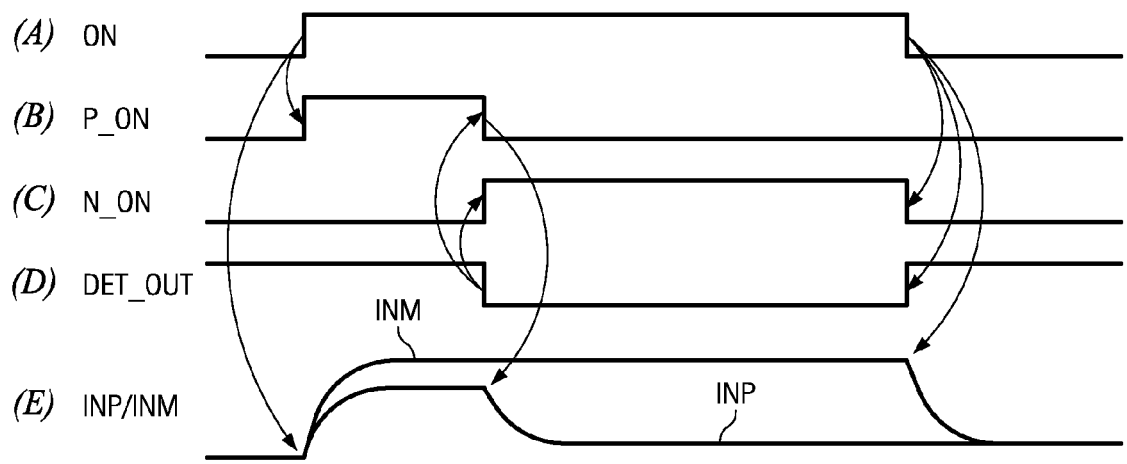
FIG. 5 is a diagram illustrating an operation example when the drive current of the switch circuit is smaller than the reference current.

FIG. 5 shows an operation example in the case when the drive current Ion of switch circuit SW(n+1)_2 is smaller than reference current Iref.

Power storage device CL(n+1) is connected to the low potential side. When the potential at node VC(n+1) is close to ground level GND, the source of MOS transistor Q8 does not maintain voltage (VBG−Vth), and drive current Ion becomes smaller than reference current Iref. As a result, since the drain voltage INP of MOS transistor Q8 becomes lower than the source voltage of MOS transistor Q8A (FIG. 5(E)), the output signal DET_OUT of comparator 131 goes to the low level (FIG. 5(D)). When output signal DET_OUT goes to the low level, the signal input from latch circuit 132 to AND-gate 133 goes to the low level. Since the output signal P_ON of AND-gate 133 is at the low level (FIG. 5(B)), MOS transistors Q3, Q4 turn off. On the other hand, the signal input from latch circuit 132 to drive voltage generating circuit 134 goes to the high level. Since drive voltage N_ON is at the high level (FIG. 5(C)), MOS transistors Q5, Q6 turn on. Selection circuit 117 was explained above.

Voltage Amplification Circuit 118

In the following, voltage amplification circuit 118 will be explained.

Figure 6:
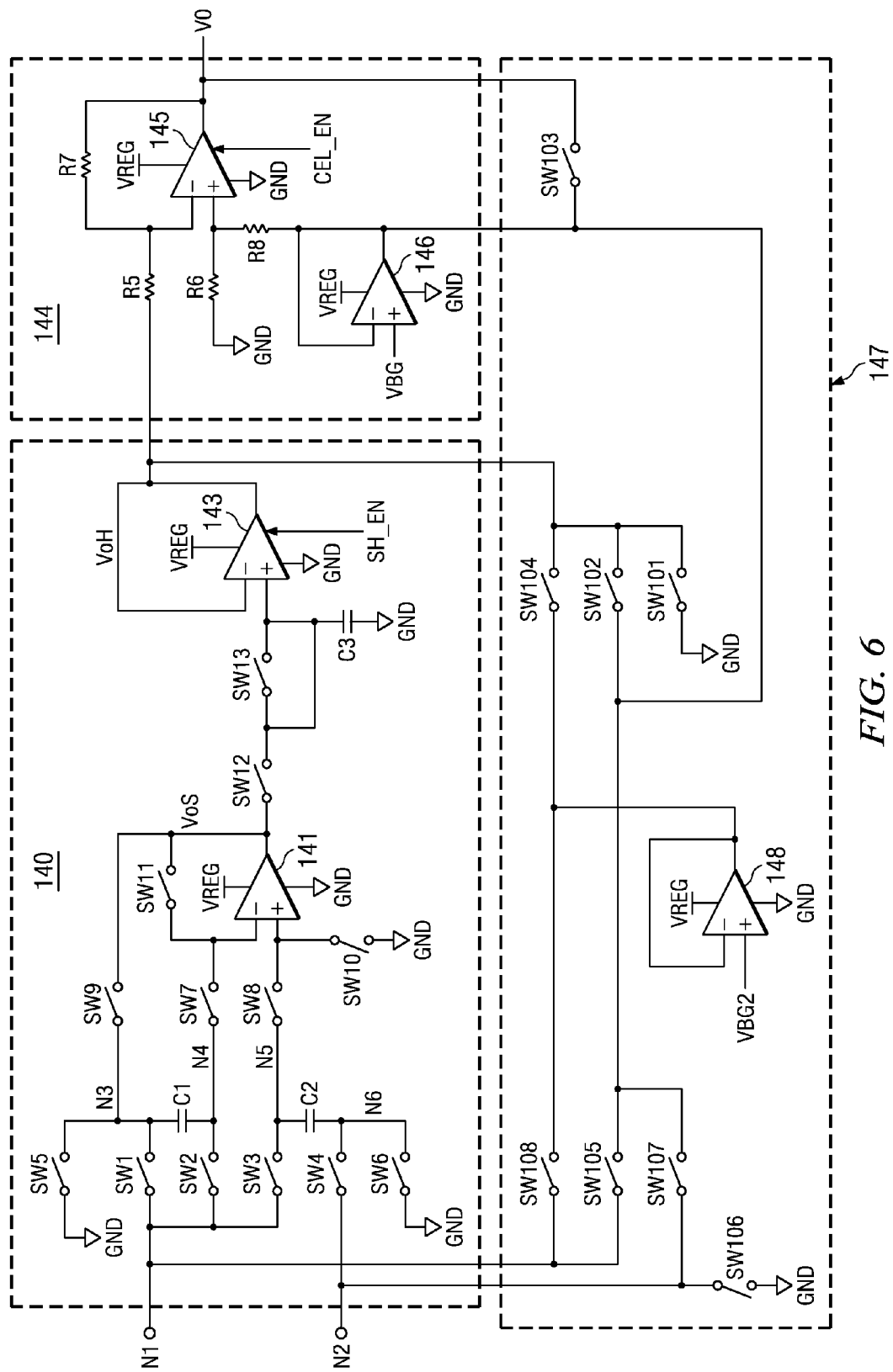
FIG. 6 is a diagram illustrating an example of the configuration of the voltage amplification circuit.

FIG. 6 is a diagram illustrating an example of the configuration of voltage amplification circuit 118.

Voltage amplification circuit 118 shown in FIG. 6 has sample-and-hold circuit 140, differential amplifier circuit 144, correction signal input circuit 147. Sample-and-hold circuit 140 has switch elements SW1-SW13, capacitors C1-C3, amplifier circuit 141, buffer circuit 143.

Differential amplifier circuit 144 has resistors R5-R8, amplifier circuit 145, buffer circuit 146.

Correction signal input circuit 147 has switch elements 101-108 and amplification circuit 148.

Sample-and-hold circuit 140 is an example of the sampling circuit of the present invention.

Amplifier circuit 141 is an example of the amplification circuit of the present invention.

Capacitor C1 is an example of the first capacitor of the present invention. Capacitor C2 is an example of the second capacitor of the present invention. Switch element Sw1 is an example of the first switch element of the present invention. Switch element SW2 is an example of the second switch element in the present invention. Switch element SW3 is an example of the third switch element in the present invention. Switch element SW4 is an example of the fourth switch element in the present invention. Switch element SW5 is an example of the fifth switch element in the present invention. Switch element SW6 is an example of the sixth switch element in the present invention. Switch element SW7 is an example of the seventh switch element in the present invention. Switch element SW8 is an example of the eighth switch element in the present invention. Switch element SW9 is an example of the ninth switch element in the present invention. Buffer circuit 143 is an example of the buffer circuit in the present invention. Switch element SW12 is an example of the tenth switch element in the present invention. Capacitor C3 is an example of the third capacitor in the present invention.

When the voltage of the power storage device selected by selection circuit 117 is output to output node pair (N1, N2), sample-and-hold circuit 140 samples the voltage at output node pair (N1, N2) with ground level GND used as a reference by turning on and off switches SW1-SW13 under the control of control circuit 122 to convert the voltage into voltage VoS. Then, the sampled voltage VoS is held for a prescribed period of time and output as voltage VoH.

Capacitor C1 is connected between nodes N3 and N4. Capacitor C2 has the same electrostatic capacitance as capacitor C1 and is connected between nodes N5 and N6. Amplifier circuit 141 amplifies the difference voltage obtained by subtracting the voltage at the negative input terminal from the voltage at the positive input terminal with ground level GND used as a reference and outputs it as voltage VoS. For example, amplifier circuit 141 is constituted with a voltage-amplification-type operational amplifier having a very high amplifier gain and very high input impedance at the positive and negative input terminals.

Switch element SW1 is connected between nodes N3 and N1. Switch element SW2 is connected between nodes N4 and N1. Switch element SW3 is connected between nodes N5 and N1. Switch elements SW4 is connected between nodes N6 and N2. Switch element SW5 is connected between node N3 and ground level GND. Switch element SW6 is connected between node N6 and ground level GND. Switch element SW7 is connected between node N4 and the negative input terminal of amplifier circuit 141. Switch element SW8 is connected between node N5 and the positive input terminal of amplifier circuit 141. Switch element SW9 is connected between node N3 and the output terminal of amplifier circuit 141. Said switch elements SW1-SW9 have the same configuration as the circuit block of switch SWn_1, SW(n+1)_2 contained within the dotted lines shown in FIG. 3. Switch element SW10 is connected between the positive input terminal of amplifier circuit 141 and ground level GND.

Switch element SW11 is connected between the output terminal and the negative input terminal of amplifier circuit 141. Switch element SW12 is connected between the output terminal of amplifier circuit 141 and the input terminal of buffer circuit 143. Switch element SW13 is a dummy switch used for canceling the influence of the clock feedthrough in switch element SW12. It is connected in parallel with the current path between switch element SW12 and buffer circuit 143. It is driven out of phase with respect to switch element SW12.

Capacitor C3 is connected between the input terminal of buffer circuit 143 and ground level GND. Buffer circuit 143 generates output voltage VoH that is approximately equal to the voltage input to the high-impedance non-inverting input terminal. For example, as shown in FIG. 6, the buffer circuit is constituted with a voltage-amplification-type operational amplifier that negatively feeds back the output voltage to the inverting input terminal. The output terminal of buffer circuit 143 can be set to high impedance corresponding to control signal SH_EN of control circuit 122.

Differential amplifier circuit 144 amplifies voltage VoH of the power storage element sampled and held by sample-and-hold circuit 140 with a prescribed gain and outputs it as voltage VoH. Resistor R5 is connected between the output terminal of buffer circuit 143 and the inverting input terminal of amplifier circuit 145. Resistor R6 has the same resistance as resistor R5 and is connected between the non-inverting input terminal of amplifier circuit 145 and ground level GND. Resistor R8 is connected between the output terminal of buffer circuit 146 and the non-inverting input terminal of amplifier circuit 145. Resistor R7 has the same resistance as resistor R8 and is connected between the output terminal and the inverting input terminal of amplifier circuit 145.

Buffer circuit 146 generates an output voltage that is approximately equal to reference voltage VBG input to the high impedance non-inverting input terminal. For example, as shown in FIG. 6, the buffer circuit is constituted with a voltage-amplification-type operational amplifier that negatively feeds back the output voltage to the inverting input terminal.

Amplifier circuit 145 amplifies the difference voltage obtained by subtracting the voltage at the inverting input terminal from the voltage at the non-inverting input terminal using ground level GND as reference and outputs it as voltage VO. For example, amplifier circuit 145 is constituted with a voltage amplification-type operational amplifier with very high amplifier gain and very high input impedance at non-inverting input terminal and inverting input terminal. The output terminal of amplifier circuit 145 can be set to high impedance corresponding to control signal CEL_EN of control circuit 122. If the resistance of resistors R5, R6 is "r5" and the resistance of resistors R7, R8 is "r7," voltage VO output from amplifier circuit 145 becomes approximately "VBG−(r7/r5)×VoS."

Correction signal input circuit 147 inputs prescribed signals to various parts of sample-and-hold circuit 140 and differential amplifier circuit 144 under the control of control circuit 122 in order to correct the voltage of the power storage element output via sample-and-hold circuit 140 and differential amplifier circuit 144.

Switch element SW101 is connected between the input terminal of differential amplifier circuit 144 (the output terminal of buffer circuit 146) and ground level GND. Switch element SW102 is connected between the output terminal of buffer circuit 146 and the input terminal of differential amplifier circuit 144. Switch element SW103 is connected between the output terminal of buffer circuit 146 and the output terminal of differential amplifier circuit 144 (output terminal of amplifier circuit 145). Switch element SW104 is connected between the output terminal of buffer circuit 148 and the input terminal of differential amplifier circuit 144. Switch element SW105 is connected between the output terminal of buffer circuit 146 and node N1. Switch element SW106 is connected between node N2 and ground level GND. Switch element SW107 is connected between the output terminal of buffer circuit 146 and node N2. Switch element SW108 is connected between the output terminal of buffer circuit 148 and node N1.

Buffer circuit 148 generates a voltage that is approximately equal to reference voltage VBG2 input to the high-impedance input terminal. For example, as shown in FIG. 6, the buffer circuit is constituted with a voltage amplification-type operational amplifier that negatively feeds back the output voltage to the inverting input terminal.

In the following, the operation of voltage amplification circuit 118 having said configuration will be explained.

First, the operation of sample-and-hold circuit 140 will be explained.

Figure 7:
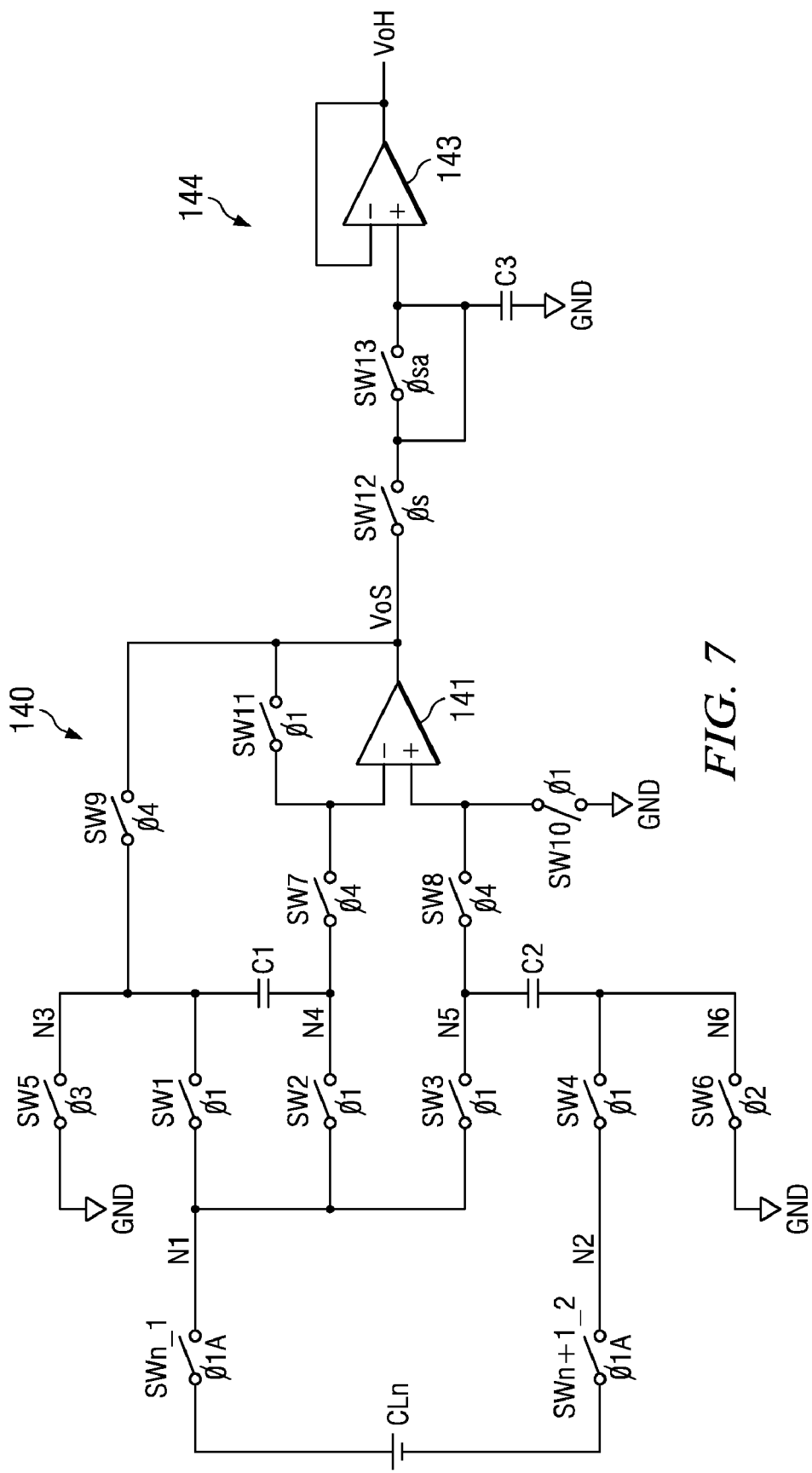
FIG. 7 is a diagram illustrating the main parts in the sample-and-hold circuit shown in FIG. 6

FIG. 7 shows the main parts of sample-and-hold circuit 140 in FIG. 6.

As shown in FIG. 7, switches SW1, SW2, SW3, SW4, SW10, SW11 are turned on and off at the same time corresponding to control signal 1. The switch circuits SWn_1, SW(n+1)_2 of selection circuit 121 are turned on and off at the same time corresponding to control signal 1A. Switch element SW6 is turned on and off corresponding to control signal 2. Switch element SW5 is turned on and off corresponding to control signal 3. Switch elements SW7, SW8, SW9 are turned on and off at the same time corresponding to control signal 4. Switch SW12 is turned on and off corresponding to control signal s. Switch SW13 is turned on and off corresponding to control signal sa, which is out of phase with respect to control signal s.

Figure 8:
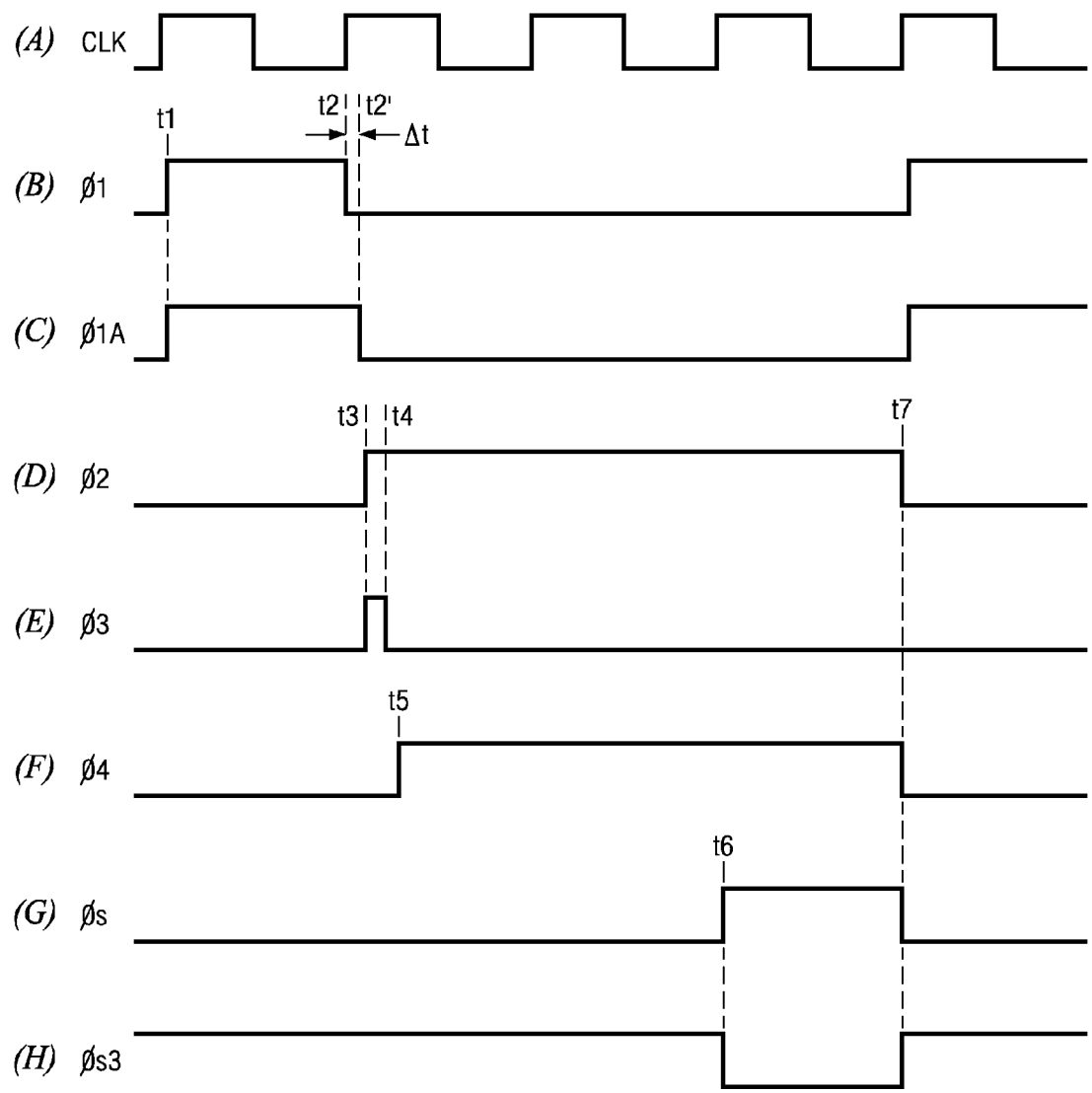
FIG. 8 is a diagram illustrating an example of the on and off timing of each switch element in the sample-and-hold circuit.

FIG. 8 shows the timing of turning switch elements (SW1-SW11) on and off.

In the example shown in FIG. 8, when the control signals (1, 1A, 2, 3, 4, s, sa) supplied from control circuit 122 are at the high level, the switch elements are turned on. When the control signals are at the low level, said switch elements are turned off.

Figure 9:
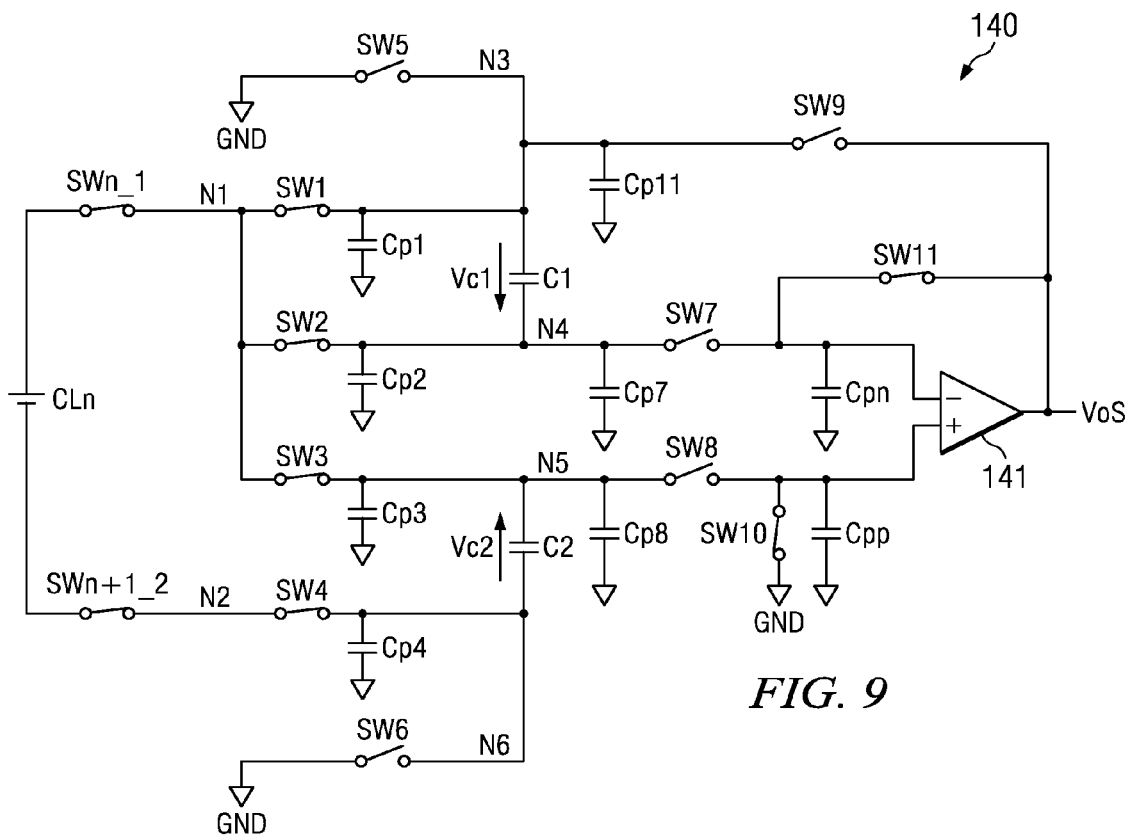
FIG. 9 is a first diagram explaining the state of each switch element in the sample-and-hold circuit.

The clock signal CLK in FIG. 8(A) is based on the operation timing of control circuit 122. First, at time t1, control signals 1, 1A are set to the high level (FIGS. 8(B), (C)), while other control signals are set to the low level (FIGS. 8(D)-(H)). In this way, as shown in FIG. 9, switch elements SW1, SW2, SW3, SW4, SW10, SW11 are turned on, while switch elements SW5, SW6, SW7, SW8, and SW9 are turned off.

At that time, since the circuit is short-circuited by switch elements SW1, SW2, the voltage on capacitor C1 is zero. On the other hand, since nodes N5, N6 and nodes N1, N2 are connected to switch elements SW3, SW4, Vc2 of capacitor C2 is equal to the voltage of power storage element CLn. In the following, when the voltages at nodes VCn, VC(n+1) are represented by the same symbol, the voltage of capacitor C2 becomes "VCn−VC(n+1)." Also, at that time, since switch elements SW10, SW11 are on, the parasitic capacitance component (Cpn, Cpp) at each input terminal of amplifier circuit 141 are both discharged to 0 V. Then, at time t2, switch elements SW1, SW2, SW3, SW4, SW10, SW11 are turned off (1=low level). At time t2', switch circuit SWn_1, SW(n+1)>2 are turned on (1A=low level). When switch elements SW1, SW2, SW3, SW4, SW10, SW11 are turned off with switch circuits SWn_1, SW(n+1)_2 on, nodes N1, N2 are kept to a low impedance with respect to the power storage element, and switch elements SW1, SW2, SW3, SW4 are turned off.

At that time, charge Qc1 stored in capacitor C1 and charge Qc2 stored in capacitor C2 can be expressed as follows:

[Mathematical equation 1]

$$Qc1 = VCn \cdot (Cp2 + Cp7) \tag{1}$$

$$Qn2 = (VCn - VCn+1) \cdot C2 + VCn \cdot (Cp3 + Cp8) \tag{2}$$

Figure 10:
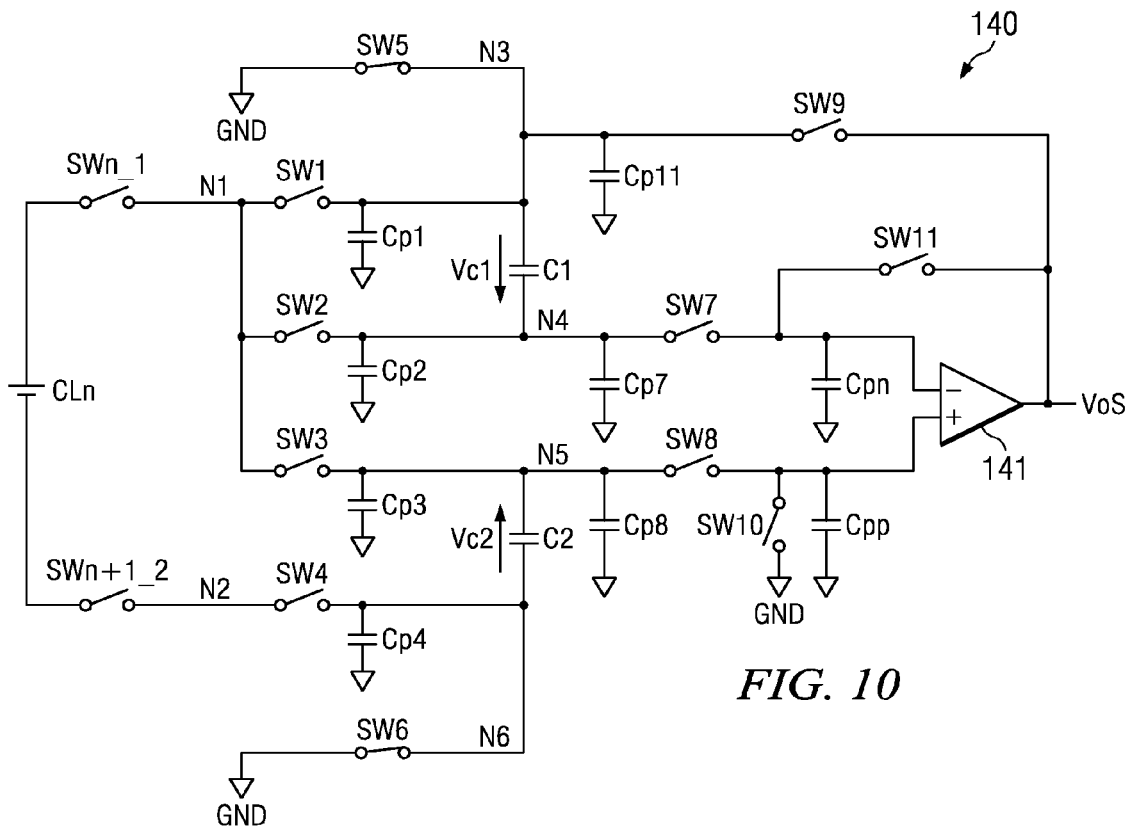
FIG. 10 is a second diagram explaining the state of each switch element in the sample-and-hold circuit.

In the aforementioned equation, "C1" is the electrostatic capacitance of capacitor C1, "C2" is the electrostatic capacitance of capacitor C2. Also, "Cp2," "Cp7," "Cp3," "Cp8" are the parasitic capacitances of switch elements SW2, SW7, SW3, SW8, respectively. Then, at time t3, when switch elements SW5, SW6 are turned on (2, 3=high level), the voltage Vc2 of capacitors C1, C2 is level shifted to ground level GND. FIG. 10 shows the connection state of sample-and-hold circuit 140 at that time. At that time, the charge Qc1 of capacitor C1 is distributed to capacitor C1 and parasitic capacitances Cp2, Cp7. The charge Qc2 of capacitor C2 is distributed to capacitor C2 and parasitic capacitance Cp3, Cp8. Therefore, voltages Vc1, Vc2 can be expressed as follows:

[Mathematical equation 2]

$$Vc1 = \{VCn \cdot (Cp2 + Cp7)\}/(C1 + Cp2 + Cp7) \tag{3}$$

$$Vc2 = \{(VCn - VCn+1) \cdot C2 + VCn \cdot (Cp3 + Cp8)\}/(C2 + Cp3 + Cp8) \tag{4}$$

Figure 11:
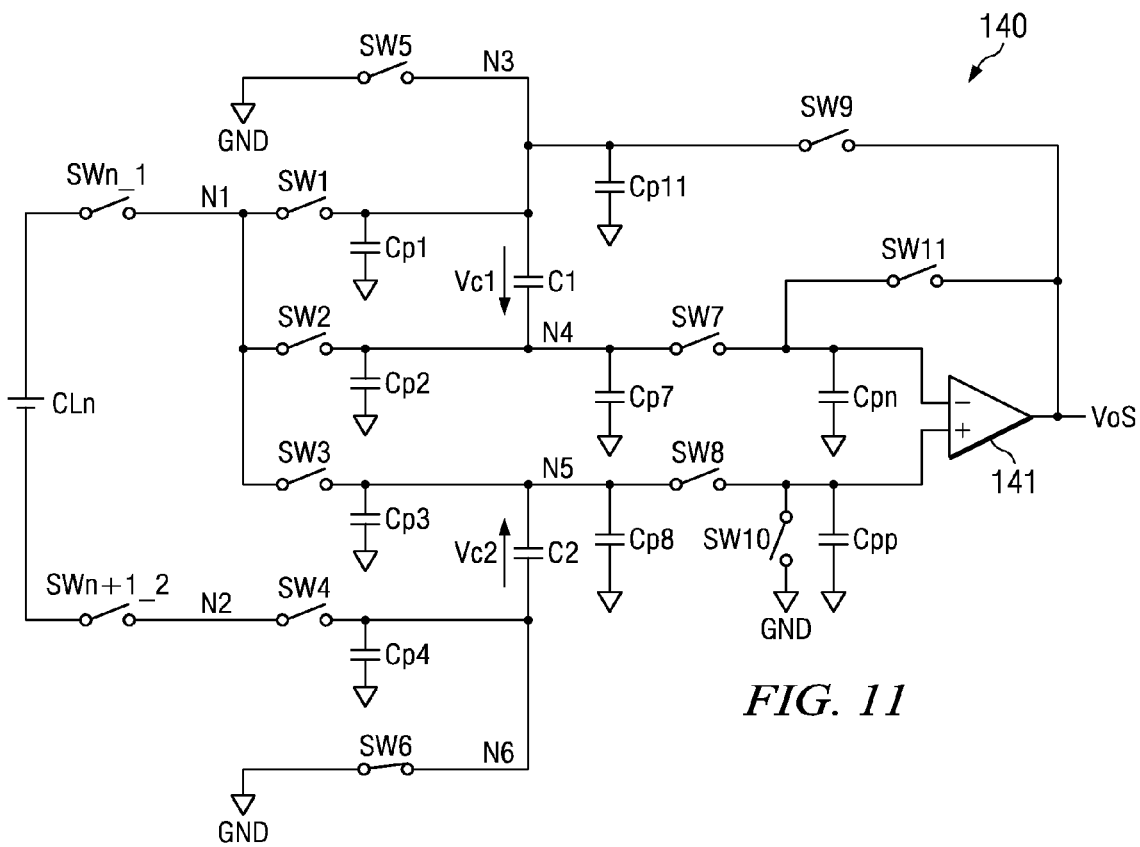
FIG. 11 is a third diagram explaining the state of each switch element in the sample-and-hold circuit.
Figure 12:
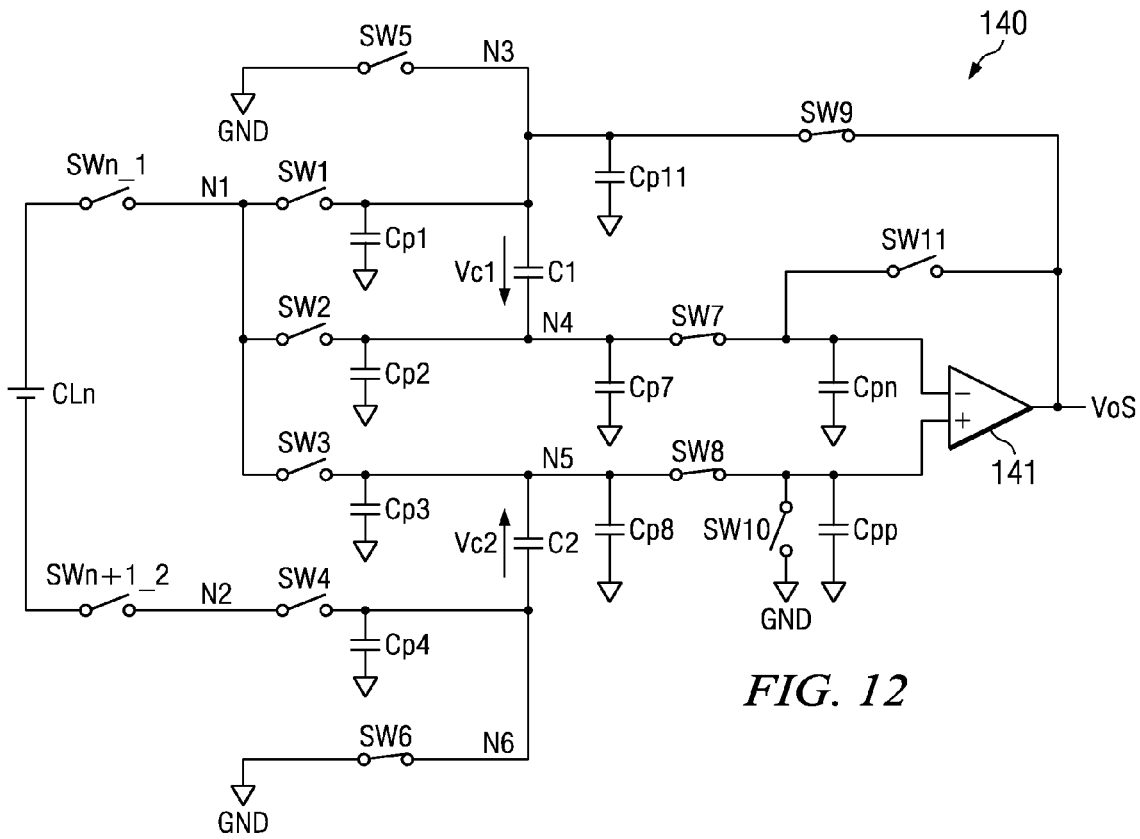
FIG. 12 is a fourth diagram explaining the state of each switch element in the sample-and-hold circuit.

Then, at time t4, switch element SW5 is turned off (3=low level). FIG. 11 shows the connection state of sample-and-hold circuit 140 at that time. In this way, node N3 is separated from ground level GND. Then, at time t5, switch elements SW7, SW8, SW9 are turned on (4=high level). FIG. 2 shows the connection state of sample-and-hold circuit 140 at that time.

In this way, the output voltage of amplifier circuit 141 is negatively fed back to the inverting input terminal via switch element SW9 and capacitor C1. Therefore, the negative feedback control is performed so that the non-inverting input terminal and the inverting input terminal of amplifier circuit 141 are at approximately the same voltage.

In this case, for simplification, the electrostatic capacitances of capacitors C1, C2 are both taken as "C." The sum of parasitic capacitances (Cp2+Cp7) and (Cp3+Cp8) are both taken as "CP." The voltage of the power storage device "VCn-VCn+1) is taken as "Vcel." The voltages at the non-inverting input terminal and inverting input terminal of amplifier circuit 141 are both taken as "CPA." In this case, the voltages Vc1, Vc2 immediately after switch elements SW7, SW8, SW9 are turned on can be expressed as follows:

[Mathematical equation 3]

$$Vc1 = VCn \cdot CP/(C+CP+CPA) \quad (5)$$

$$Vc2 = \{Vcel1 \cdot C + VCn \cdot CP\}/(C+CP+CPA) \quad (6)$$

In this case, when the inverting input terminal of amplifier circuit 141 is charged to voltage Vc2 under the negative feedback control, the charge on capacitor C1 can be expressed as follows:

[Mathematical equation 4]

$$\begin{aligned} Qc1 &= (Vc2 - Vc1) \cdot (CP + CPA) \\ &= \{C \cdot Vcell - (CP + CPA)\}/(C + CP + CPA) \end{aligned} \quad (7)$$

When the inverting input terminal of amplifier circuit 141 is charged to voltage Vc2, the voltage of capacitor C1 is lowered by as much as (Qc1/C). At that time, all of the charges Qc1 stored on capacitor C1 can be expressed as follows:

[Mathematical equation 5]

$$\begin{aligned} Qc1\_2 &= Vc1 \cdot c - Qc1 \\ &= (Vcn \cdot CP - Vcell \cdot \\ &\quad (CP + CPA)\} \cdot \\ &\quad C/(C + CP + CPA) \end{aligned} \quad (8)$$

The output voltage VoS of amplifier circuit 141 is expressed as follows using voltage Vc2 of Equation 6 and voltage Vc1_2 of capacitor C2 used for accumulating charge Qc1_2 shown in Equation 8.

[Mathematical equation 6]

$$\begin{aligned} VoS &= Vc2 - Vc1\_2 \\ &= Vc2 - Qc1\_2/C \\ &= Vcell \end{aligned} \quad (9)$$

As shown in equation 9, the influence of parasitic capacitances Cp2, Cp7, Cp3, Cp8 on the output of amplification 141 cancel each other out. Thus, correct voltage Vcel1 of power storage device CLn is output.

In the following, the operation of correction signal input circuit 147 will be explained.

Step 1

Figure 13:
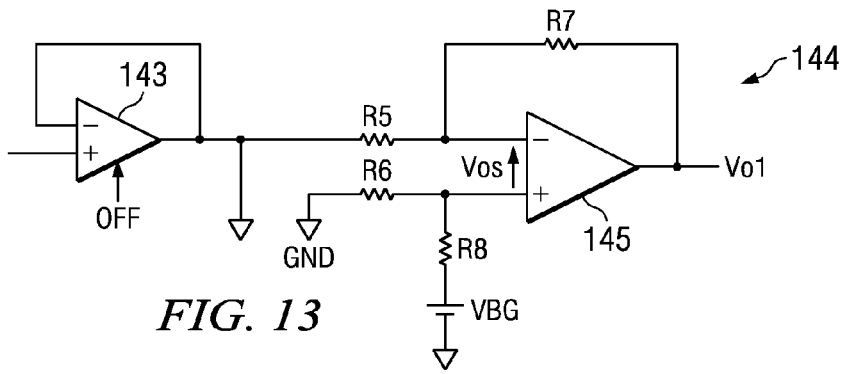
FIG. 13 is a first diagram explaining the connection state of the voltage amplification circuit during correction.

To correct the output voltage of voltage amplification circuit 118, first, switch element SW101 is turned on, while other switch elements (SW1-2-SW108) are turned off. The output voltage VoH of amplifier circuit 145 is measured by microcomputer 160. In other words, output voltage VoH is measured when the input terminal of differential amplifier circuit 144 is short-circuited to ground level GND. At that time, the output terminal of buffer circuit 143 is set to high impedance by control signal SH_EN. FIG. 13 shows the connection state of voltage amplification circuit 118 in that state. The voltage VoH measured in that connection state is recorded in the memory of microcomputer 160 as "Vo1."

Step 2

Then, switch element SW102 is turned on, while other switch elements (SW101, SW103-SW108) are turned off.

Figure 14:
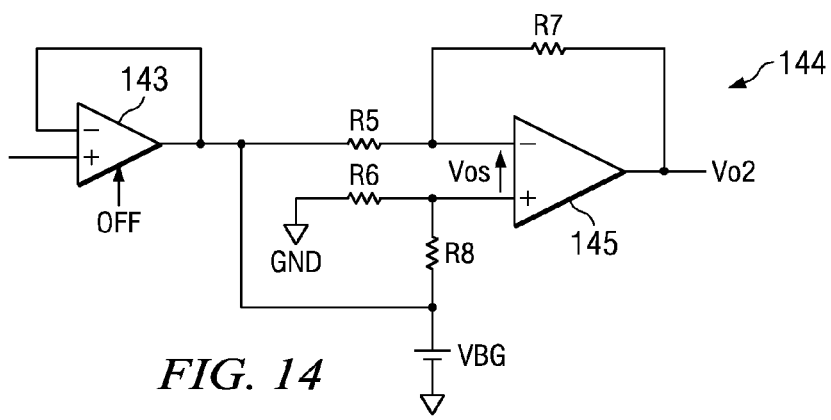
FIG. 14 is a second diagram explaining the connection state of the voltage amplification circuit during correction.

Output voltage VoH is measured by microcomputer 160. In other words, output voltage VoH is measured when reference voltage VBG is input to the input terminal of differential amplifier circuit 144. At that time, the output terminal of buffer circuit 143 is set to high impedance by control signal SH_EN. FIG. 14 shows the connection state of voltage amplification circuit 118 in that state. The voltage VoH measured in that connection state is recorded as "Vo2" in the memory of microcomputer 160.

Step 3

Figure 15:
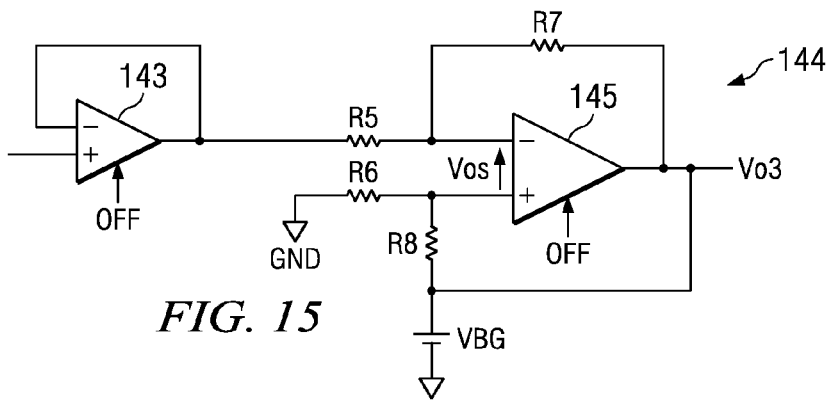
FIG. 15 is a third diagram explaining the connection state of the voltage amplification circuit during correction.

Then, switch element SW103 is turned on, and other switch elements (SW101, SW102, SW104-SW108) are turned off. Reference voltage VBG is directly measured by microcomputer 160. At that time, the output terminal of amplifier circuit 145 is set to high impedance by control signal CEL_EN. FIG. 15 shows the connection state of voltage amplification circuit 118 in that state. The voltage VoH measured in that connection state is recorded as "Vo3" in the memory of microcomputer 160.

The gain Kact of differential amplifier circuit 144 and offset voltage Vos are calculated as follows:

[Mathematical equation 7]

$$VBG = Vo3 \quad (10)$$

$$Kact = (Vo2 - Vo1) \quad (11)$$

$$Vos = (Vo1 - VBG)/(1 + Kact) \quad (12)$$

Step 4

Figure 16:
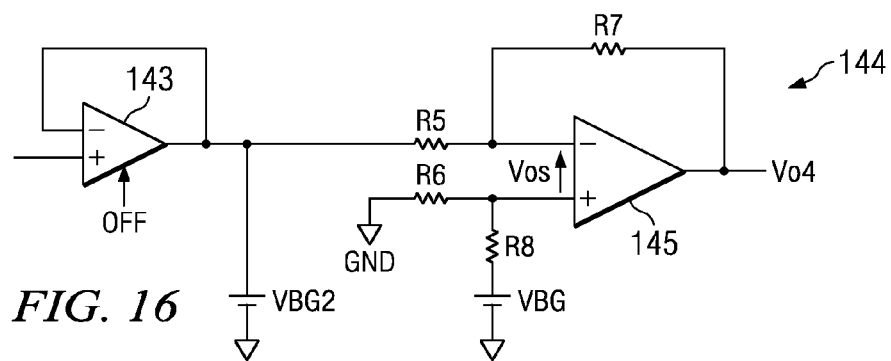
FIG. 16 is a fourth diagram explaining the connection state of the voltage amplification circuit during correction.

Then, switch element SW104 is turned on, and other switch elements (SW101-SW103, SW105-SW108) are turned off. Output voltage VoH is measured by microcomputer 160. In other words, output voltage VoH is measured when reference voltage VBG2 is input to the input terminal of differential amplifier circuit 144. At that time, the output terminal of buffer circuit 143 is set to high impedance by control signal SH_EN. FIG. 16 shows the connection state of voltage amplification circuit 118 in that state.

Voltage VoH measured in that connection state is recorded as "Vo4" in the memory of microcomputer 160.

Reference voltage VBG2 is calculated as follows:

[Mathematical equation 8]

$$VBG2 = \{VBG + VOS \cdot (1 + Kact) - Vo4\}/Kact \quad (13)$$

Step 5

Figure 17:
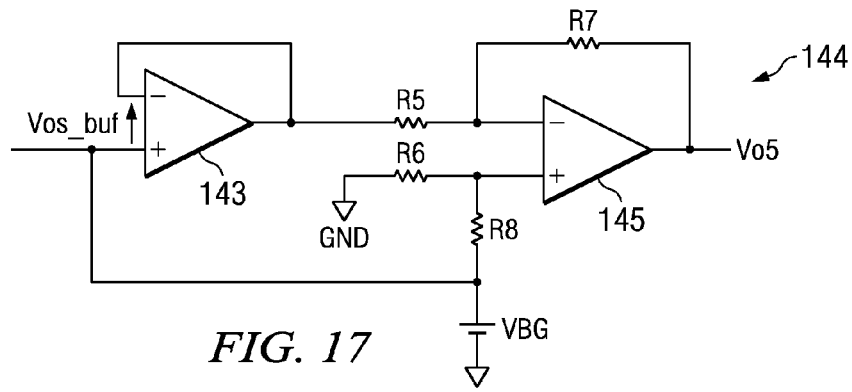
FIG. 17 is a fifth diagram explaining the connection state of the voltage amplification circuit during correction.

Then, switch elements SW105, SW1, SW9, SW12 are turned on, while other switch elements (SW101-SW104, SW106-SW108) are turned off. Output voltage VoH is measured by microcomputer 160. In other words, output voltage VoH is measured when reference voltage VBG is input to the input terminal of buffer circuit 143. FIG. 17 shows the connection state of voltage amplification circuit 118 in that state. Voltage VoH measured in that connection state is recorded as "Vo5" in the memory of microcomputer 160.

The offset Vos_Buf of buffer circuit 143 at that time is calculated as follows.

[Mathematical equation 9]

$$Vos\_buf = (Vo2 - Vo5)/Kact \quad (14)$$

Step 6

Figure 18:
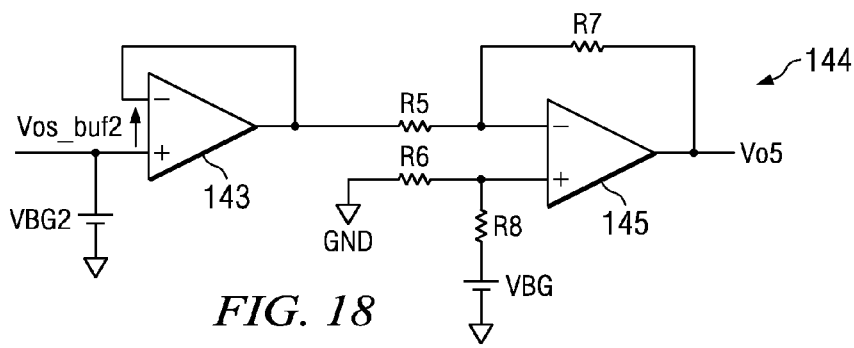
FIG. 18 is a sixth diagram explaining the connection state of the voltage amplification circuit during correction.

Then, switch elements SW108, SW1, SW9, SW12 are turned on, and other switch elements (SW101-SW107) are turned off. The output voltage VoH is measured by microcomputer 160. In other words, output voltage VoH is measured when reference voltage VBG2 is input to the input terminal of buffer circuit 143. FIG. 18 shows the connection state of voltage amplification circuit 118 in that state. Voltage VoH measured in that connection state is recorded as "Vo6" in the memory of microcomputer 160.

The offset Vos_buf2 of buffer circuit 143 at that time is calculated as follows:

[Mathematical equation 10]

$$Vos\_buf2 = (Vo4 - Vo6)/Kact \quad (15)$$

From equations 14 and 15, the common mode rejection ratio CMRR_buf of buffer circuit 143 is calculated as follows:

[Mathematical equation 11]

$$CMRR1\_buff = (Vos\_buf2 - Vos\_buf)/(VBG2 - VBG) \quad (16)$$

Step 7

Figure 19:
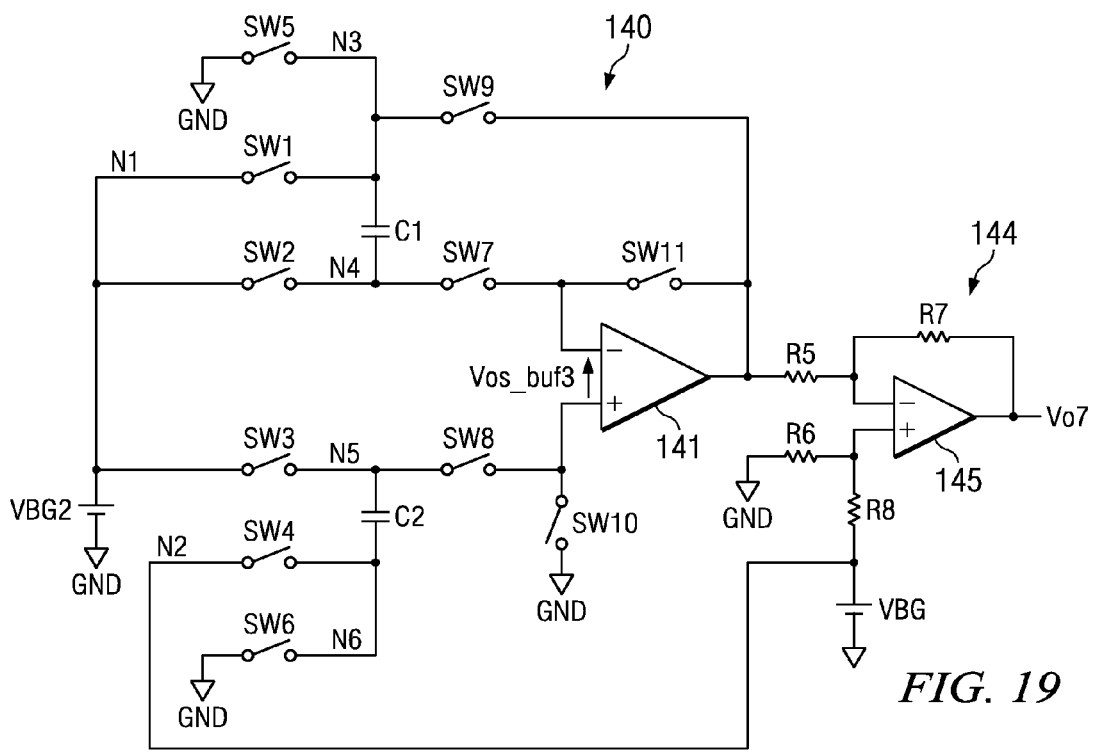
FIG. 19 is a seventh diagram explaining the connection state of the voltage amplification circuit during correction.

Then, in the state when switch elements SW108 and SW107 are turned on while other switch elements (SW101-SW106) are turned off, the sample-and-hold operation explained above is carried out. The output voltage VoH as the result of the sample-and-hold operation is measured by microcomputer 160. In other words, the output voltage VoH in the case of carrying out the sample-and-hold operation with node N1 set to reference voltage VBG2 and node N2 set to reference voltage VBG is measured. FIG. 19 shows the connection state of voltage amplification circuit 118 in that state.

Voltage VoH measured in that connection state is recorded as "Vo7" in the memory of microcomputer 160.

The offset Vos_buf3 and common mode rejection ratio CMRR_cap of buffer circuit 143 at that time are calculated as follows:

[Mathematical equation 12]

$$Vos\_buf3 = (VBG - VBG2) + \{VBG + Vos \cdot (1+Kact) - Vo7\}/Kact \quad (17)$$

$$CMRR\_cap = \{Vos\_buf3 - Vos\_buf - CMRR\_buf \cdot (VBG2 - 2 \cdot VBG)\}/VBG \quad (18)$$

Common mode rejection ratio CMRR_cap is restricted by the mismatch of the electrostatic capacitances of capacitors C1, C2.

In this case, when the voltage between nodes N1 and N2 is taken as "VIN," VoS, VoH are calculated as follows:

[Mathematical equation 13]

$$VoH = VBG + (1+Kact) \cdot Vos - Kact \cdot VoS \quad (19)$$

$$Vos = (VBG/Kact) + (1+1/Kact) \cdot Vos - VoH/Kact \quad (20)$$

$$VoS = VIN + (VCn+1 \cdot CMRR\_cap) + Vos\_buf + (VIN - VBG) \cdot CMRR\_buf \quad (21)$$

Based on these equations, voltage VIN is calculated as follows:

[Mathematical equation 14]

$$VIN = [VoS - VCn+1 \cdot CMRR\_cap - Vos\_buf + VBG \cdot CMRR\_buf]/(1+CMRR\_buf) \quad (22)$$

In this case, the approximate value of "VCn+1" is known because of a previous measurement. In this case, if the common mode rejection ratios CMRR_buf, CMRR_cap are small enough to be ignored, voltage VIN can be calculated as follows.

[Mathematical equation 14]

$$\begin{aligned} VIN &= VoS - Vos\_buf \\ &= (VBG/Kact) + \\ &\quad (1+1/Kact) \cdot Vos - VoH/Kact - Vos\_buf \end{aligned} \quad (23)$$

When voltage VIN is calculated according to equation 23, step 4, step 6, and step 7 explained above are not needed.

As explained above, according to this embodiment, a certain drive voltage for turning on p-type MOS transistors Q3, Q4 of selection circuit 121 is generated based on a certain drive current Ion flowing from a power storage device to ground level GND. In other words, even if the power storage device selected by selection circuit 121 has a high potential with respect to ground level GND, the drive voltage applied between the gate and source of MOS transistors Q3, Q4 can be kept constant. Consequently, even if the number of the series connected power storage devices is increased and the potential of the selected power storage element is increased, the breakdown voltage between the gate and source of MOS transistors Q3, Q4 can be kept constant. Therefore, the element size of MOS transistors Q3, Q4 and the increase in the circuit surface area can be restrained.

Also, according to this embodiment, when the switch element is turned on, drive current Ion flowing from resistor R2 to MOS transistor Q8 is compared with reference current Iref to determine whether it is smaller than a prescribed threshold value needed for turning on the series circuit of MOS transistors Q3, Q4. If drive current Ion is below the prescribed threshold value, the series circuit of n-type MOS transistors Q5, Q5 connected in parallel with the series circuit of MOS transistors Q3, Q4 will be turned on by drive voltage N_ON generated by drive voltage generating circuit 134.

In this way, even if the voltage of resistor R2 cannot turn on MOS transistors Q3, Q4 due to the small potential difference between the selected power storage device and ground level GND, since MOS transistors Q5, Q6 are turned on instead, the nodes (VCn, VCn+1) of the power storage device can be connected reliably to the output nodes (N1, N2).

Also, according to this embodiment, for switch circuits SWn_1, SW(n+1)_2 that are turned on at the same time when a power storage device is selected, it is determined whether their drive current Ion is below a prescribed threshold value. The series circuit of MOS transistors Q3, Q4 or the series circuit of MOS transistors Q5, Q6 is turned on corresponding to the judgment result. In this way, it is possible to avoid turning on p-type MOS transistors Q3, Q4 with a high on-resistance in one of switch circuits SWn_1, SW(n+1)_2 and turning on the series circuit of n-type MOS transistors Q5, Q6 with low resistance in the other switch circuit. Consequently, the difference in voltage drop between the two switch circuits can be suppressed.

Also, according to this embodiment, the influence of the parasitic capacitors of the switch elements in sample-and-hold circuit 140 cancel each other out so that highly-accurate voltage conversion can be performed. Consequently, even if the electrostatic capacitances of capacitors C1, C2 are not significantly higher than the parasitic capacitances, the accuracy of the voltage conversion will not be seriously affected. Therefore, the electrostatic capacitances of capacitors C1, C2 can be reduced compared with the system in which the influence of the parasitic capacitances cannot cancel each other out. Consequently, the increase of the circuit surface area can be suppressed.

An embodiment of the present invention was explained above. The present invention is not limited to this embodiment but includes many variations.

Figure 20:
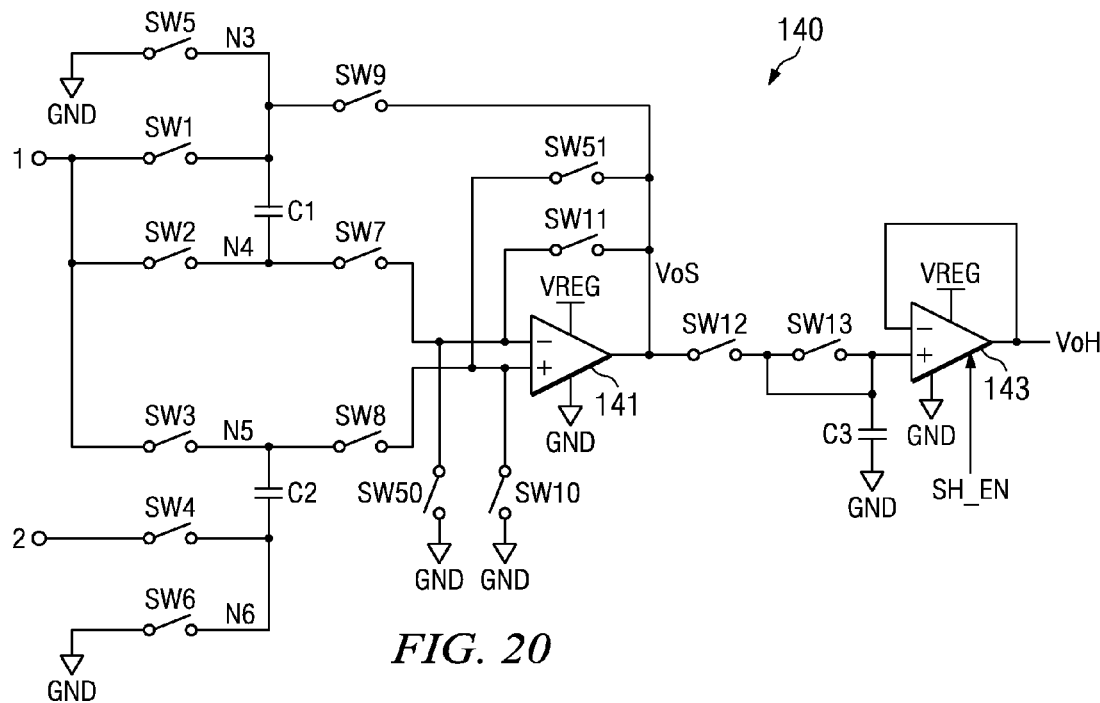
FIG. 20 is a diagram illustrating a modification example of the sample-and-hold circuit.

FIG. 20 shows a variant of sample-and-hold circuit 140. The sample-and-hold circuit 140 shown in FIG. 20 adds switch elements SW50, Sw51 to sample-and-hold circuit 140 shown in FIG. 6, while other constituent elements are the same as those of sample-and-hold circuit 140 shown in FIG. 6.

Switch elements SW50, SW51 have almost the same parasitic capacitances as switch elements SW10, SW11. They are kept off constantly. Switch element SW50 is connected between the inverting input terminal of amplifier circuit 141 and ground level GND. Switch element SW51 is connected between the non-inverting input terminal and output terminal of amplifier circuit 141.

Since the output terminal of amplifier circuit 141 has a higher impedance than that of ground level GND, even if the parasitic capacitances of switch elements SW10, SW11 are approximately equal, the amount of charge stored in them will be different. If the amount of stored charge is different, there will be an error in output voltage VoS with respect to the voltage Vce11 of the power storage device. However, if switch elements SW50, SW51 are used as shown in FIG. 20, since each input terminal of amplifier circuit 141 has almost the same parasitic capacitance with respect to the output terminal of amplification terminal 141 and ground level GND, the difference in the amount of stored charge on the parasitic capacitance of each input terminal of amplifier circuit 141 is reduced so that the error of output voltage VoS can also be reduced.

Switch elements SW50, SW51 can be kept off constantly as described above. However, the on and off state of these switch elements can be controlled dynamically during the period besides the period when outputting the voltage conversion result of the power storage device.

Figure 21:
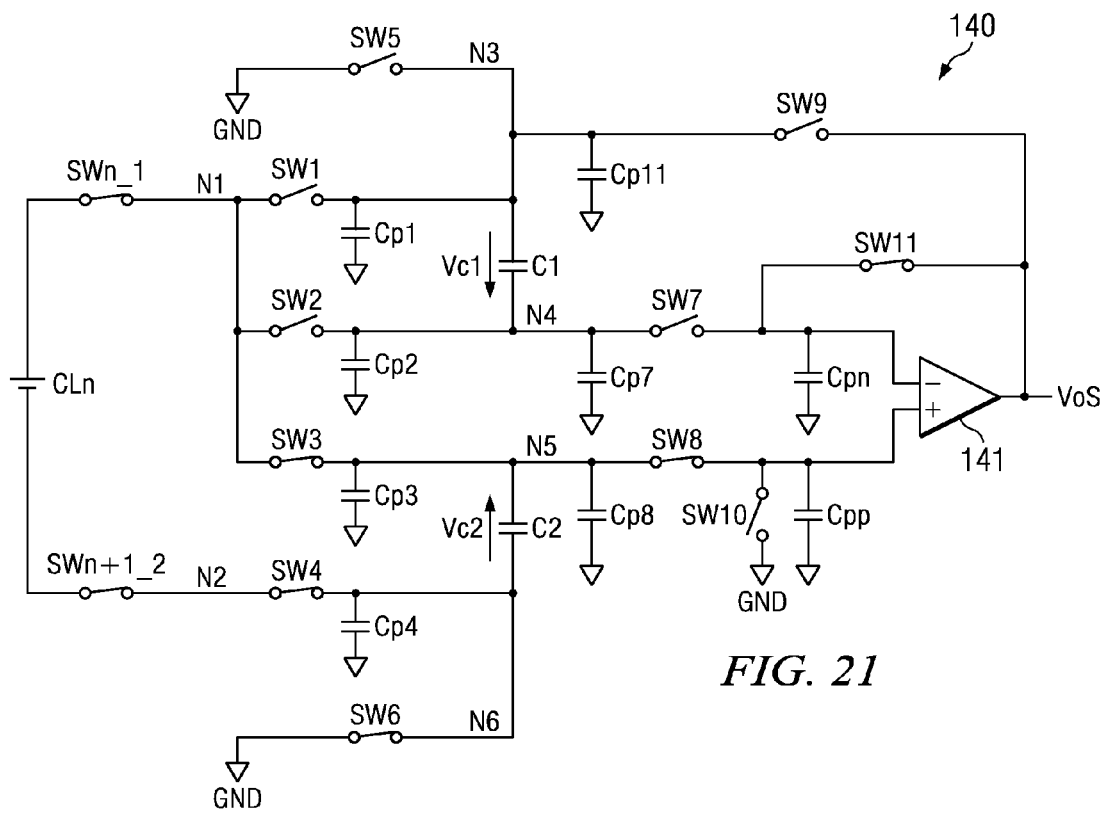
FIG. 21 is a diagram illustrating another operation example of the sample-and-hold circuit.

FIG. 21 shows another operation example of sample-and-hold circuit 140.

In the operation example of sample-and-hold circuit 140 explained based on FIGS. 8-12, after the voltage of the power storage device selected by selection circuit 117 is temporarily stored on capacitor C2, capacitor C2 is connected to ground level GND to perform conversion of the voltage level. However, it is also possible to send the output of selection circuit 117 directly without performing said conversion of voltage level if the voltage of power storage device CL10 connected to ground level GND is already output. FIG. 21 shows the state of each switch element for that case.

In the operation example shown in FIG. 21, when power storage device CL10 is selected by selection circuit 117, switch elements SW3, SW4, SW6, SW8, SW11 are turned on, while switch elements SW1, SW2, SW5, SW7, Sw9, SW10 are turned off. In this way, amplifier circuit 141 operates as a buffer circuit, and the voltage of output node pair (N1, N2) is output directly. As a result, voltage VoS becomes approximately equal to the voltage of power storage device CL10.

In the aforementioned embodiments, sample-and-hold circuit 140 is used as an example of the sampling circuit. However, the present invention is not limited in this way. For example, when monitoring the over-voltage of each power storage device based on the output voltage VoS of amplifier circuit 141, since there is no need to measure output voltage VoS with high accuracy, voltage VoS can be compared directly with a comparator to detect an over-voltage. In this case, the holding circuit (buffer circuit 143, switch elements SW12,SW13) is not needed. The holding circuit is also not needed if microcomputer 160 has a highly-accurate analog/digital converter that can operate at high speed. Therefore, the holding circuit after the sampling circuit according to the embodiment of the present invention can be omitted. For example, the number of power storage devices connected in series and the number of switches can be changed appropriately. Resistor R2 is an element used for generating the drive voltage corresponding to drive current Ion. It is also possible to use other voltage generating elements, such as Zenner diodes.

While the invention has been particularly shown and described with reference to preferred embodiments thereof it is well understood by those skilled in the art that various changes and modifications can be made in the invention without departing from the spirit and scope of the invention as defined by the appended claims.

The invention claimed is:

1. A voltage converting circuit that converts the voltage of each of a plurality of power storage devices connected in series into a voltage using a predetermined potential as a reference, comprising:
    a selection circuit that connects a power storage device selected from said plural power storage devices to an output node pair;
    a sampling circuit that samples the voltage of said output node pair using said predetermined potential as a reference when said power storage device is selected by said selection circuit;
    said selection circuit comprising plural switch circuits that connect the terminals of each of said plural power storage devices to said output node pair;
    said switch circuit comprising a switch element connected between one of said power storage devices and one of said output nodes; and
    a drive circuit that generates a drive voltage for turning on said switch element based on a drive current flowing from said power storage device to said predetermined potential.

2. The voltage converting circuit described in claim 1 wherein said drive circuit includes a drive current generating circuit that generates the drive current if said switch element is turned on; and
    a voltage generating element inserted in the path of said drive current for generating the drive voltage for turning on said switch element when the drive current flows.

3. The voltage converting circuit described in claim 2 wherein said switch element includes a series circuit of a first transistor and a second transistor of a first conductivity type connected between one of said power storage devices and one of said output nodes;
    said drive current generating circuit generates said drive current flowing from a middle connection point of said first and second transistors connected in series with said predetermined potential;
    said voltage generating element has one of its terminals connected to said middle connection point and another terminal connected to the control terminals of said first and second transistors.

4. The voltage converting circuit described in claim 3 wherein said switch element includes a series circuit of a third transistor and a fourth transistor of a second conductivity type connected in parallel with the series circuit of said first and second transistors;
    said drive circuit includes a judging circuit that determines whether said drive current generated by said drive current generating circuit when said switch element is turned on is below a prescribed threshold value that can turn on the series circuit of said first and second transistors; and
    a drive voltage generating circuit that turns on said third and fourth transistors corresponding to the judgment result of said judging circuit.

5. The voltage converting circuit described in claim 4 wherein two of said switch circuits that are turned on at the same time when one of said power storage devices is selected share said judging circuit and turn on or off the series circuit of said third and fourth transistors at the same time corresponding to the judgment result of the shared judging circuit.

6. The voltage converting circuit described in claim 4 wherein said judging circuit has a reference current generating circuit that has a circuit configuration equivalent to that of said drive current generating circuit and generates a reference current equivalent to the drive current generated by said drive circuit generating circuit;
   a comparator that compares the node voltage in the path of said drive current in said drive current generating circuit with the node voltage in the path of said reference current in said reference current generating circuit; and
   a signal generating circuit that turns on either the series circuit of said first and second transistors or the series circuit of said third and fourth transistors and turns off the other series circuit corresponding to the comparison result of said comparator.

7. The voltage converting circuit described in claim 1, wherein:
   said output node pair has a first node and a second node;
      said sampling circuit has a first transistor connected between the third and fourth nodes;
      a second capacitor connected between the fifth and the sixth nodes and having the same electrostatic capacitance as said first capacitor;
      an amplifier that uses said predetermined potential as a reference and amplifies the voltage obtained by subtracting the voltage at the second input terminal from the voltage at the first input terminal;
      a first switch element connected between the third and the first nodes;
      a second switch element connected between the fourth and the first nodes;
      a third switch element connected between the fifth and the first nodes;
      a fourth switch element connected between the sixth and the second nodes;
      a fifth switch element connected between the third node and said predetermined potential;
      a sixth switch element connected between the sixth node and said predetermined potential;
      a seventh switch element connected between the fourth node and second input terminal;
      an eighth switch element connected between the fifth node and the first input terminal;
      a ninth switch element connected between the third node an the output terminal of said amplifier; and
      a control circuit that controls said first through the ninth switch elements;
      said control circuit keeps the first, second, third, and fourth switch elements on and keeps the fifth, sixth, seventh, eighth, and ninth switch elements off in the first stage, turns off the first, second, third, and fourth switch elements in the second stage after the first stage, turns on the fifth and sixth switch elements in the third stage after the second stage, turns off the fifth switch element in the fourth stage after the third stage, and turns on the seventh, eighth, and ninth switch elements in the fifth stage after the fourth stage.

8. The voltage converting circuit described in claim 7 wherein:
   said sampling circuit includes a buffer circuit that generating an output voltage corresponding to the input voltage;
   a tenth switch element connected between the output terminal of said amplifier and the input terminal of said buffer circuit; and
   a third capacitor connected between the input terminal of said buffer circuit and said prescribed potential;
   said control circuit turns on the tenth switch element in the sixth stage after the fifth stage and turns off the tenth switch in the seventh stage after the sixth stage.

9. The voltage converting circuit described in claim 5 wherein said judging circuit has a reference current generating circuit that has a circuit configuration equivalent to that of said drive current generating circuit and generates a reference current equivalent to the drive current generated by said drive circuit generating circuit;
   a comparator that compares the node voltage in the path of said drive current in said drive current generating circuit with the node voltage in the path of said reference current in said reference current generating circuit; and
   a signal generating circuit that turns on either the series circuit of said first and second transistors or the series circuit of said third and fourth transistors and turns off the other series circuit corresponding to the comparison result of said comparator.

10. The voltage converting circuit described in claim 2, wherein:
    said output node pair has a first node and a second node;
       said sampling circuit has a first transistor connected between the third and fourth nodes;
       a second capacitor connected between the fifth and the sixth nodes and having the same electrostatic capacitance as said first capacitor;
       an amplifier that uses said predetermined potential as a reference and amplifies the voltage obtained by subtracting the voltage at the second input terminal from the voltage at the first input terminal;
       a first switch element connected between the third and the first nodes;
       a second switch element connected between the fourth and the first nodes;
       a third switch element connected between the fifth and the first nodes;
       a fourth switch element connected between the sixth and the second nodes;
       a fifth switch element connected between the third node and said predetermined potential;
       a sixth switch element connected between the sixth node and said predetermined potential;
       a seventh switch element connected between the fourth node and second input terminal;
       an eighth switch element connected between the fifth node and the first input terminal;
       a ninth switch element connected between the third node an the output terminal of said amplifier; and
       a control circuit that controls said first through the ninth switch elements;
       said control circuit keeps the first, second, third, and fourth switch elements on and keeps the fifth, sixth, seventh, eighth, and ninth switch elements off in the first stage, turns off the first, second, third, and fourth switch elements in the second stage after the first stage, turns on the fifth and sixth switch elements in the third stage after the second stage, turns off the fifth switch element in the fourth stage after the third stage, and turns on the seventh, eighth, and ninth switch elements in the fifth stage after the fourth stage.

11. The voltage converting circuit described in claim 3, wherein:

said output node pair has a first node and a second node;

said sampling circuit has a first transistor connected between the third and fourth nodes;

a second capacitor connected between the fifth and the sixth nodes and having the same electrostatic capacitance as said first capacitor;

an amplifier that uses said predetermined potential as a reference and amplifies the voltage obtained by subtracting the voltage at the second input terminal from the voltage at the first input terminal;

a first switch element connected between the third and the first nodes;

a second switch element connected between the fourth and the first nodes;

a third switch element connected between the fifth and the first nodes;

a fourth switch element connected between the sixth and the second nodes;

a fifth switch element connected between the third node and said predetermined potential;

a sixth switch element connected between the sixth node and said predetermined potential;

a seventh switch element connected between the fourth node and second input terminal;

an eighth switch element connected between the fifth node and the first input terminal;

a ninth switch element connected between the third node an the output terminal of said amplifier; and a control circuit that controls said first through the ninth switch elements;

said control circuit keeps the first, second, third, and fourth switch elements on and keeps the fifth, sixth, seventh, eighth, and ninth switch elements off in the first stage, turns off the first, second, third, and fourth switch elements in the second stage after the first stage, turns on the fifth and sixth switch elements in the third stage after the second stage, turns off the fifth switch element in the fourth stage after the third stage, and turns on the seventh, eighth, and ninth switch elements in the fifth stage after the fourth stage.

12. The voltage converting circuit described in claim 4, wherein:

said output node pair has a first node and a second node;

said sampling circuit has a first transistor connected between the third and fourth nodes;

a second capacitor connected between the fifth and the sixth nodes and having the same electrostatic capacitance as said first capacitor;

an amplifier that uses said predetermined potential as a reference and amplifies the voltage obtained by subtracting the voltage at the second input terminal from the voltage at the first input terminal;

a first switch element connected between the third and the first nodes;

a second switch element connected between the fourth and the first nodes;

a third switch element connected between the fifth and the first nodes;

a fourth switch element connected between the sixth and the second nodes;

a fifth switch element connected between the third node and said predetermined potential;

a sixth switch element connected between the sixth node and said predetermined potential;

a seventh switch element connected between the fourth node and second input terminal;

an eighth switch element connected between the fifth node and the first input terminal;

a ninth switch element connected between the third node an the output terminal of said amplifier; and a control circuit that controls said first through the ninth switch elements;

said control circuit keeps the first, second, third, and fourth switch elements on and keeps the fifth, sixth, seventh, eighth, and ninth switch elements off in the first stage, turns off the first, second, third, and fourth switch elements in the second stage after the first stage, turns on the fifth and sixth switch elements in the third stage after the second stage, turns off the fifth switch element in the fourth stage after the third stage, and turns on the seventh, eighth, and ninth switch elements in the fifth stage after the fourth stage.

13. The voltage converting circuit described in claim 5, wherein:

said output node pair has a first node and a second node;

said sampling circuit has a first transistor connected between the third and fourth nodes;

a second capacitor connected between the fifth and the sixth nodes and having the same electrostatic capacitance as said first capacitor;

an amplifier that uses said predetermined potential as a reference and amplifies the voltage obtained by subtracting the voltage at the second input terminal from the voltage at the first input terminal;

a first switch element connected between the third and the first nodes;

a second switch element connected between the fourth and the first nodes;

a third switch element connected between the fifth and the first nodes;

a fourth switch element connected between the sixth and the second nodes;

a fifth switch element connected between the third node and said predetermined potential;

a sixth switch element connected between the sixth node and said predetermined potential;

a seventh switch element connected between the fourth node and second input terminal;

an eighth switch element connected between the fifth node and the first input terminal;

a ninth switch element connected between the third node an the output terminal of said amplifier; and a control circuit that controls said first through the ninth switch elements;

said control circuit keeps the first, second, third, and fourth switch elements on and keeps the fifth, sixth, seventh, eighth, and ninth switch elements off in the first stage, turns off the first, second, third, and fourth switch elements in the second stage after the first stage, turns on the fifth and sixth switch elements in the third stage after the second stage, turns off the fifth switch element in the fourth stage after the third stage, and turns on the seventh, eighth, and ninth switch elements in the fifth stage after the fourth stage.

14. The voltage converting circuit described in claim 6, wherein:
- said output node pair has a first node and a second node;
- said sampling circuit has a first transistor connected between the third and fourth nodes;
- a second capacitor connected between the fifth and the sixth nodes and having the same electrostatic capacitance as said first capacitor;
- an amplifier that uses said predetermined potential as a reference and amplifies the voltage obtained by subtracting the voltage at the second input terminal from the voltage at the first input terminal;
- a first switch element connected between the third and the first nodes;
- a second switch element connected between the fourth and the first nodes;
- a third switch element connected between the fifth and the first nodes;
- a fourth switch element connected between the sixth and the second nodes;
- a fifth switch element connected between the third node and said predetermined potential;
- a sixth switch element connected between the sixth node and said predetermined potential;
- a seventh switch element connected between the fourth node and second input terminal;
- an eighth switch element connected between the fifth node and the first input terminal;
- a ninth switch element connected between the third node an the output terminal of said amplifier; and
- a control circuit that controls said first through the ninth switch elements;
- said control circuit keeps the first, second, third, and fourth switch elements on and keeps the fifth, sixth, seventh, eighth, and ninth switch elements off in the first stage, turns off the first, second, third, and fourth switch elements in the second stage after the first stage, turns on the fifth and sixth switch elements in the third stage after the second stage, turns off the fifth switch element in the fourth stage after the third stage, and turns on the seventh, eighth, and ninth switch elements in the fifth stage after the fourth stage.

15. A battery device comprising:
- plural power storage devices connected in series;
- a voltage converting circuit that converts the voltage of each of said plural power storage devices into a voltage using a predetermined potential as a reference, a current bypass circuit that bypasses the current flowing through each of said plural power storage devices corresponding to an input control signal, and a control circuit that measures the voltage of each power storage device converted by said voltage converting circuit and generates said control signal for controlling said current bypass circuit so that the voltages of said plural power storage devices become uniform based on the measurement result;
- said voltage converting circuit has a selection circuit that connects one power storage device selected from said plural power storage devices to an output node pair and a sampling circuit that samples the voltage of said output node pair using said predetermined potential as a reference when said one power storage device is selected by said selection circuit;
- said switch circuit has a switch element connected between one of said power storage devices and one of said output nodes and a drive circuit that generates a drive voltage for turning on said switch element based on a drive current flowing from said power storage device to said predetermined potential.

16. A method of converting the voltage of each of a plurality of power storage devices connected in series into a voltage using a predetermined potential as a reference, comprising:
- connecting a power storage device selected from said plural power storage devices to an output node pair utilizing plural switch circuits having a switch element connected between one of said power storage devices and one of said output nodes and a drive circuit that generates a drive voltage for turning on said switch element based on a drive current flowing from said power storage device to said predetermined potential;
- sampling the voltage of said output node pair using said predetermined potential as a reference when said power storage device is selected by said selection circuit.

* * * * *